(12) United States Patent
Sasaya et al.

(10) Patent No.: US 6,958,803 B2
(45) Date of Patent: Oct. 25, 2005

(54) PROJECTION EXPOSURE APPARATUS AND METHOD WITH ADJUSTMENT OF ROTATIONALLY ASYMMETRIC OPTICAL CHARACTERISTICS

(75) Inventors: Toshihiro Sasaya, Yokohama (JP); Kazumasa Endo, Kawasaki (JP); Kazuo Ushida, Setagaya-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/619,515

(22) Filed: Jul. 16, 2003

(65) Prior Publication Data

US 2004/0046950 A1 Mar. 11, 2004

Related U.S. Application Data

(63) Continuation of application No. 10/032,462, filed on Jan. 2, 2002, now abandoned, which is a continuation of application No. 09/714,945, filed on Nov. 20, 2000, now abandoned, which is a continuation of application No. 08/360,515, filed on Dec. 21, 1994, now Pat. No. 6,262,793.

(30) Foreign Application Priority Data

Dec. 22, 1993 (JP) .............................. 5/323721

(51) Int. Cl.[7] .......................... G03B 27/42; G03B 27/68
(52) U.S. Cl. ............................ 355/55; 355/52; 355/53
(58) Field of Search ............................ 355/52, 53, 55

(56) References Cited

U.S. PATENT DOCUMENTS 3,583,790 A   6/1971   Baker
4,259,004 A   3/1981   Tateoka et al.

(Continued)

FOREIGN PATENT DOCUMENTS

CH   PS 504863      7/1969
EP   A2-0 307 726   3/1989
EP   A1-0 660 169   6/1995

(Continued)

OTHER PUBLICATIONS

"ABC Der Optik", Karl Mutze, Verlag Werner Dausien, Hanau/Main, 1972, pp. 25–27 and 65.
"Lexikon der Optik", Heinz Haferkorn, Verlag Werner, Dausien, Hanau/Main, 1990, p. 57.
Partial Translation of CH–PS 504863.
Partial Translation of "ABC Der Optik".
Partial Translation of "Lexikon der Optik".
English–language translation of JP–A–59–144127.
English–language translation of JP–A–63–232320.
English–language translation of JP–A–63–6553.

*Primary Examiner*—Hoang Ngo
(74) *Attorney, Agent, or Firm*—Oliff & Berridge, PLC

(57) ABSTRACT

A high-performance projection exposure apparatus and method which can adjust optical characteristics which are rotationally asymmetric with respect to the optical axis of projection optical system and which remain in the projection optical system. In exemplary embodiments, the projection exposure apparatus includes an illumination optical system, a projection optical system and a plurality of optical elements. The illumination optical system illuminates a first object, and the projection optical system projects an image of the first object onto a second object under a predetermined magnification. The optical elements are set between the first object and the second object, and has rotationally asymmetric powers with respect to an optical axis of the projection optical system. Consequently, the optical elements can correct an optical characteristic rotationally asymmetric with respect to the optical axis of the projection optical system remaining in the projection optical system.

116 Claims, 9 Drawing Sheets

U.S. PATENT DOCUMENTS

| | | |
|---|---|---|
| 4,666,273 A | 5/1987 | Shimizu et al. |
| 4,730,900 A | 3/1988 | Uehara et al. |
| 4,801,808 A | 1/1989 | Hamasaki |
| 4,801,977 A | 1/1989 | Ishizaka et al. |
| 4,871,237 A | 10/1989 | Anzai et al. |
| 4,883,345 A | 11/1989 | Anzai et al. |
| 4,888,614 A | 12/1989 | Suzuki et al. |
| 4,919,524 A | 4/1990 | Shinohara |
| 4,943,733 A | 7/1990 | Mori et al. |
| 4,965,630 A | 10/1990 | Kato et al. |
| 5,095,386 A | 3/1992 | Scheibengraber |
| 5,105,075 A | 4/1992 | Ohta et al. |
| 5,117,255 A | 5/1992 | Shiraishi et al. |
| 5,231,431 A | 7/1993 | Yano et al. |
| 5,260,832 A | 11/1993 | Togino et al. |
| 5,308,991 A | 5/1994 | Kaplan |
| 5,309,198 A | 5/1994 | Nakagawa |
| 5,350,924 A | 9/1994 | Stengl et al. |
| 5,367,406 A | 11/1994 | Suzuki et al. |
| 5,392,119 A | 2/1995 | McArthur et al. |
| 5,424,552 A | 6/1995 | Tsuji et al. |
| 5,432,587 A | 7/1995 | Nozue |
| 5,459,577 A | 10/1995 | Ototake et al. |
| 5,581,324 A | 12/1996 | Miyai et al. |
| 5,677,757 A | 10/1997 | Taniguchi et al. |
| 6,078,380 A | 6/2000 | Taniguchi et al. |

FOREIGN PATENT DOCUMENTS

| | | |
|---|---|---|
| GB | 2138163 | 10/1984 |
| JP | A-59-144127 | 8/1984 |
| JP | 61-254915 | 11/1986 |
| JP | 62-35619 | 2/1987 |
| JP | 62-35620 | 2/1987 |
| JP | A-63-6553 | 1/1988 |
| JP | A-63-185024 | 7/1988 |
| JP | 63-185024 | 7/1988 |
| JP | A-63-232320 | 9/1988 |
| JP | 4-355419 | 12/1992 |
| JP | A-4-355419 | 12/1992 |
| JP | 04-355419 | 12/1992 |
| JP | 05-173065 | 7/1993 |
| JP | 5-173065 | 7/1993 |
| JP | A-5-251303 | 9/1993 |
| JP | A-6-5490 | 1/1994 |
| JP | A-6-349702 | 12/1994 |
| JP | 63-050810 | 3/1998 |

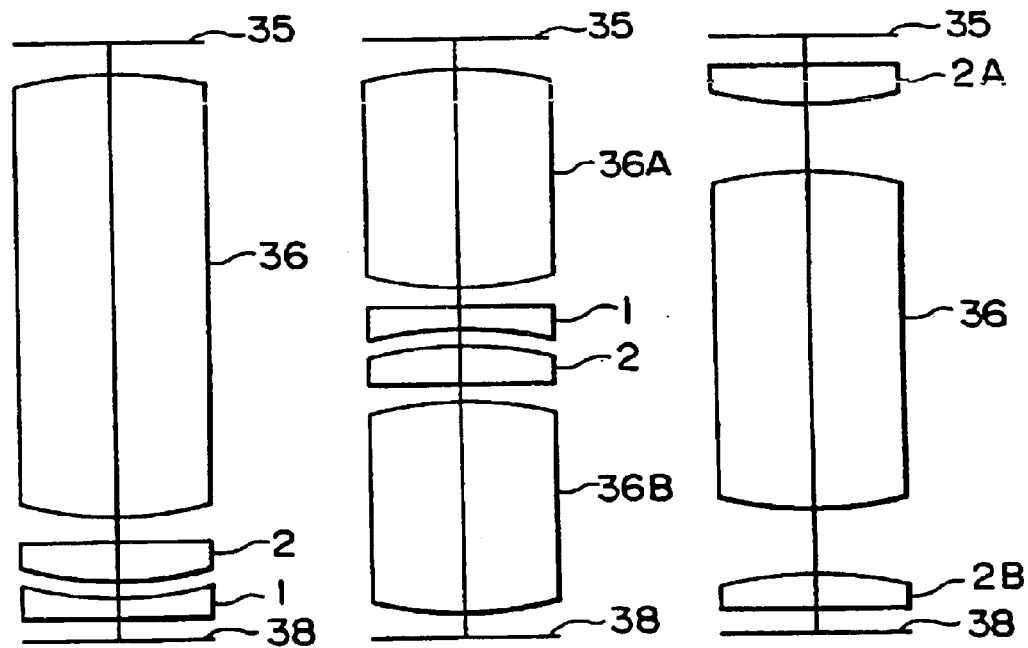
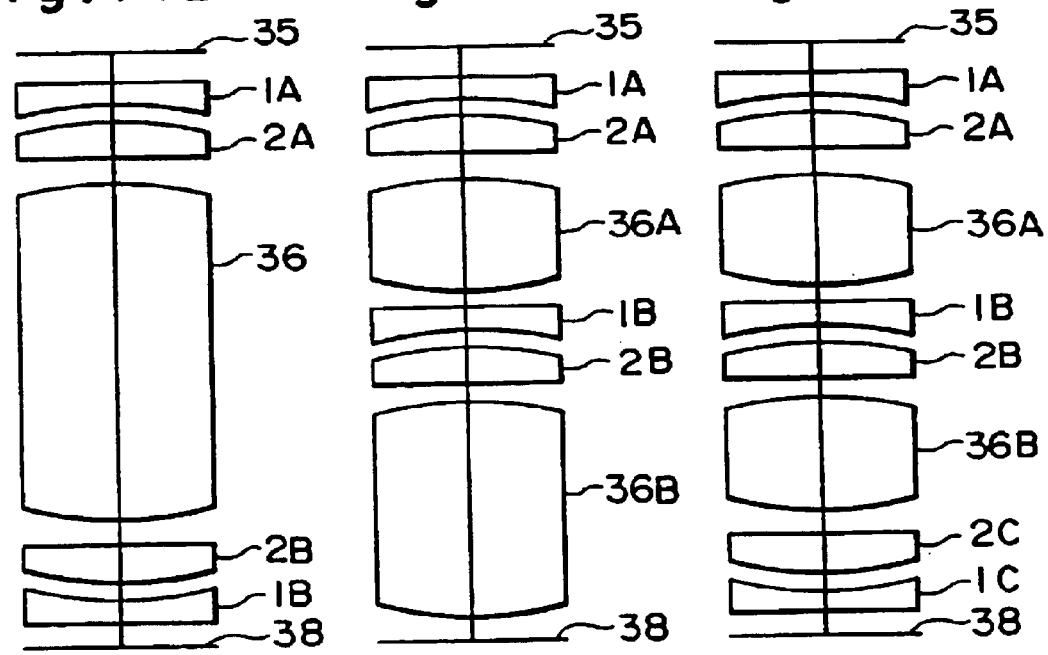

PROJECTION EXPOSURE APPARATUS AND METHOD WITH ADJUSTMENT OF ROTATIONALLY ASYMMETRIC OPTICAL CHARACTERISTICS

This is a Continuation of application Ser. No. 10/032,462, filed Jan. 2, 2002 now abandoned, which in turn is a Continuation of application Ser. No. 09/714,945, filed Nov. 20, 2000 now abandoned, which in turn is a Continuation of application Ser. No. 08/360,515, filed Dec. 21, 1994 now U.S. Pat. No. 6,262,793. The entire disclosure of the prior applications is hereby incorporated by reference herein in its entirety.

BACKGROUND OF THE INVENTION

1. Field of the Invention

The present invention relates to a projection exposure apparatus for illuminating a first object with light to reduction-project a pattern on the first object thus illuminated onto a substrate or the like as a second object. More particularly, the invention relates to a projection exposure apparatus suitable for projecting a circuit pattern formed on a reticle (mask) as the first object onto a substrate (wafer) as the second object to effect exposure thereon.

2. Related Background Art

As patterns for integrated circuits become finer, demands for performance of the projection exposure apparatus used in printing on wafer are becoming increasingly tougher these days.

Under such circumstances, a projection optical system is required to have a higher resolving power, flatness of image plane, less distortion, etc. Because of those, attempt has been made to reduce the distortion by shortening an exposure wavelength λ, increasing the numerical aperture NA of projection optical system, or decreasing the curvature of field. Some examples of such attempt are those described in U.S. Pat. No. 5,260,832, Japanese Laid-open Patent Application No. 5-173065, etc.

Also, Japanese Laid-open Patent Applications No. 59-144127 and No. 62-35620 describe methods for adjusting only a magnification error. The former describes a technique that a curved film, for example a pellicle, which is very thin and which does not affect imaging performance, is set in an optical path. The latter describes a technique that a rotationally symmetric plano-convex lens or a combination of rotationally symmetric plano-convex and plano-concave lenses is moved along the optical axis to isotropically adjust the overall magnification on the wafer surface.

The high-performance projection optical systems as disclosed in U.S. Pat. No. 5,260,832 and Japanese Laid-open Patent Application No. 5-173065, however, include a lot of constituent lenses, i.e., 15 to 24 lenses. Particularly, in the case of high-resolution projection optical systems with numerical aperture NA being at least 0.4, the number of constituent lenses is very large, i.e., 20 or more. Thus, as the demand performance becomes higher, the projection optical systems are further increasing the number of constituent lenses and are becoming very complicated in structure. Therefore, in order to actually produce these projection optical systems, to mount them on projection exposure apparatus, keeping aberrations such as the curvature of field, the astigmatism, the distortion, etc. within ranges as designed, and then to withdraw high performance, the accuracy of individual lens components and the accuracy of assembling must be controlled very strictly, which would raise problems of poor yield, very long production period, or failing to deliver sufficient performance, etc.

Further, the method for correcting the magnification error as described in Japanese Laid-open Patent Application No. 59-144127 includes a step of curving a very thin film or the like not affecting the imaging performance of optical system so as to correct the magnification error by the prism effect thereof, but it cannot make fine adjustment for a correction amount or a correction direction of an asymmetric magnification error component with directionality remaining in the projection optical system. In addition, because it employs the thin film, the film can be two-dimensionally held as bonded on a metal frame or the like for long and narrow exposure areas as in the mirror projection method, but it is very difficult for such a thin film to be three-dimensionally held and to reveal good reproducibility for rectangular or square exposure areas. If glass etc. is used instead of the thin film for holding the shape, it is also difficult to form a thin and uniform film without affecting the imaging performance. Further, there are serious problems, e.g., durability of the film etc. including breakage accident due to heat absorption or the like of exposure light in actual use of such films etc., a change in optical performance with heat absorption of exposure light or with an environmental change, etc.

Further, Japanese Laid-open Patent Application No. 62-35620 discloses the technique that the magnification error is adjusted using a rotationally symmetric lens, but only moving the rotationally symmetric lens along the optical axis can adjust only the overall magnification on the wafer surface only on an isotropic basis and cannot adjust the asymmetric magnification error component with directionality remaining in the projection optical system.

Moreover, the methods for correcting the magnification error as disclosed in Japanese Laid-open Patent Applications No. 59-144127 and No. 62-35620 can basically correct only the magnification error, but they cannot correct the astigmatism etc. as off-axial aberrations. Further, it was also difficult for the methods to handle rotationally asymmetric magnification error components or distortion components locally remaining at random in the projection optical system.

SUMMARY OF THE INVENTION

The present invention has been accomplished taking the above problems into account. It is, therefore, an object of the present invention to provide a high-performance projection exposure apparatus excellent in durability and reproducibility, which can adjust, without a very strict control of the accuracy of individual components and the accuracy of assembling, optical characteristics which are rotationally asymmetric with respect to the optical axis of projection optical system and which remain in the projection optical system, for example rotationally asymmetric off-axial aberration components (astigmatism, curvature of field, etc.), rotationally asymmetric magnification error components, etc. Further, an auxiliary object of the invention is to provide a projection exposure apparatus which can satisfactorily deal with correction of rotationally asymmetric distortion etc. locally remaining at random on a rotationally asymmetric basis in the projection optical system.

The above object and other objects will be further apparent from the following description.

Provided according to the present invention is a projection exposure apparatus comprising an illumination optical system for illuminating a first object, a projection optical system for projecting an image of the first object illuminated by the illumination optical system onto a second object under a predetermined magnification, and an optical means set between the first object and the second object, having rotationally asymmetric powers with respect to an optical axis of the projection optical system, for correcting an optical characteristic rotationally asymmetric with respect to the optical axis of the projection optical system, remaining in the projection optical system.

Also provided according to the present invention is a projection exposure apparatus comprising an illumination optical system for illuminating a first object, and a projection optical system for projecting an image of the first object illuminated by the illumination optical system onto a second object under a predetermined magnification, wherein the projection optical system has a lens, the surface thereof contributes to imaging performance of the projection optical system and has a rotationally asymmetric region having rotationally asymmetric powers with respect to the optical axis of the projection optical system, in order to correct an optical characteristic rotationally asymmetric with respect to the optical axis of the projection optical system, remaining in the projection optical system.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 14A is a drawing to show a state where a positive cylindrical lens and a negative cylindrical lens as toric lenses are placed between the wafer and the projection lens;

FIG. 14B is a drawing to show a state where a positive cylindrical lens and a negative cylindrical lens as toric lenses are placed at or near the position of the pupil of the projection lens;

FIG. 14C is a drawing to show a state where positive cylindrical lenses as toric lenses are placed between the reticle and the projection lens and between the projection lens and the wafer, respectively;

FIG. 14D is a drawing to show a state where a pair of a positive cylindrical lens and a negative cylindrical lens as toric lenses are placed between the reticle and the projection lens and another pair thereof between the projection lens and the wafer;

FIG. 14E is a drawing to show a state where a pair of a positive cylindrical lens and a negative cylindrical lens as toric lenses are placed between the reticle and the projection lens and another pair thereof at or near the position of the pupil of the projection lens;

FIG. 14F is a drawing to show a state where a pair of a positive cylindrical lens and a negative cylindrical lens as toric lenses are placed between the reticle and the projection lens, another pair thereof at or near the position of the pupil of the projection lens, and another pair thereof between the projection lens and the wafer;

DESCRIPTION OF THE PREFERRED EMBODIMENTS

Figure 1:
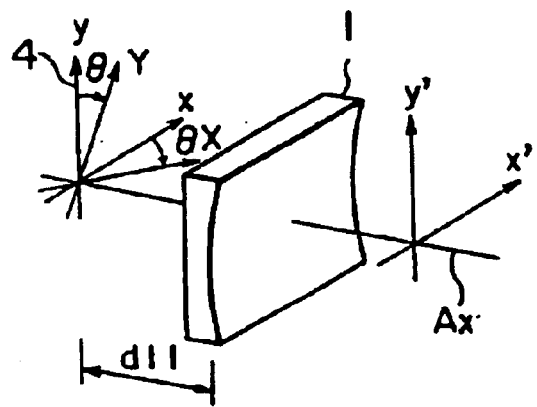
FIG. 1 is a drawing to illustrate the principle when a toric lens is a negative cylindrical lens.

As shown in FIG. 1, let f1 be a focal length in the meridional direction (the direction of yy' plane) of a cylindrical lens 1 having a negative refracting power, which is a kind of toric lens having different powers in orthogonal directions, d11 be a distance from the cylindrical lens 1 to a reticle surface 4 (xy plane) as a first object, and d12 be a position of an image point (virtual image) formed between the object point (reticle surface 4) and the cylindrical lens 1 by the cylindrical lens 1 where the object point is at the center position of the reticle surface 4 (a position of intersection between the reticle surface and the optical axis Ax). In this case, the below formulas (1) and (2) provide an image magnification β1 in the Y direction rotated by θ from the y axis (or in the direction of a plane including the optical axis Ax and the Y axis) by the cylindrical lens 1, and the distance d12 between the cylindrical lens 1 and the image point position (hereinafter simply referred to as an image position). Although not shown in FIG. 1, a projection optical system for projecting a pattern on a reticle onto a wafer is provided on the opposite side to the reticle surface 4 with respect to the cylindrical lens, which is the case as to FIG. 2 to FIG. 4 as detailed later.

$$\beta 1 = f1/(d11 \cdot \cos^2 \theta + f1) \quad (1)$$

$$d12 = d11 \cdot f1/(d11 \cdot \cos^2 \theta + f1) \quad (2)$$

Similarly, the following formulas (3) and (4) provide an image magnification $\beta1'$ and an image position $d12'$ in the X direction (or in the direction of a plane including the optical axis Ax and the X axis) perpendicular to the Y direction.

$$\beta1'=f1/(d11\cdot\sin^2\theta+f1) \qquad (3)$$

$$d12'=d11\cdot f1/(d11\cdot\sin^2\theta+f1) \qquad (4)$$

Accordingly, an astigmatism amount AS1 is given by the following formula (5).

$$AS1=d12-d12' \qquad (5)$$

It is thus understood that d11 in formula (1) to formula (4) changes by moving the cylindrical lens 1, which changes the astigmatism amount from formula (5) and which also changes the magnifications of formula (1) and formula (3).

On the other hand, it is also understood that $\theta$ in formula (1) to formula (4) changes by rotating the cylindrical lens 1, which changes the astigmatism amount from formula (5) and which also changes the magnifications of formula (1) and formula (3).

Figure 2:
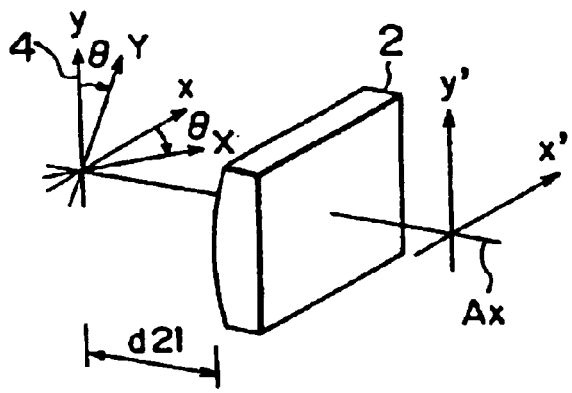
FIG. 2 is a drawing to illustrate the principle when a toric lens is a positive cylindrical lens.

Further, as shown in FIG. 2, let f2 be a focal length in the meridional direction (or in the direction of yy' plane) of a cylindrical lens 2 having a positive refracting power, which is a kind of toric lens, d21 be a distance from the cylindrical lens 2 to the reticle surface 4 (xy plane) as a first object, and d22 be a position of an image point formed by the cylindrical lens 2 where the object point is at the center position of the reticle surface 4 (a position of intersection between the reticle surface and the optical axis Ax). In this case, the below formulas (6) and (7) provide an image magnification $\beta2$ in the Y direction rotated by $\theta$ from the y axis (or in the direction of a plane including the optical axis Ax and the Y axis) by the cylindrical lens, and the distance d22 between the cylindrical lens 2 and the image point position (hereinafter simply referred to as an image position).

$$\beta2=f2/(d21\cdot\cos^2\theta+f2) \qquad (6)$$

$$d22=d21\cdot f2/(d21\cdot\cos^2\theta+f2) \qquad (7)$$

Similarly, the following formulas (8) and (9) provide an image magnification $\beta2'$ and an image position $d22'$ in the X direction (or in the direction of a plane including the optical axis Ax and the X axis) perpendicular to the Y direction.

$$\beta2'f2/(d21\cdot\sin^2\theta+f2) \qquad (8)$$

$$d22'=d21\cdot f2/(d21\cdot\sin^2\theta+f2) \qquad (9)$$

Accordingly, an astigmatism amount AS2 is given by the following formula.

$$AS2=d22-d22' \qquad (10)$$

It is thus understood that d21 in formula (6) to formula (9) changes by moving the cylindrical lens 2, which changes the astigmatism amount from formula (10) and which also changes the magnifications of formula (6) and formula (8).

On the other hand, it is also understood that $\theta$ in formula (6) to formula (9) changes by rotating the cylindrical lens 2, which changes the astigmatism amount from formula (10) and which also changes the magnifications of formula (6) and formula (8).

Now, AS1, AS2 expressed by the above formula (5) or formula (10) is an astigmatism amount which can be corrected by either cylindrical lens (1, 2).

In that case, a best focus plane is given by either one of the following formulas.

$$(d12+d12')/2 \qquad (11)$$

$$(d22+d22')/2 \qquad (12)$$

Since the best focus plane changes depending upon d11, d21, or $\theta$, it is clear that an amount of the curvature of field also changes.

As described above, it is seen that amounts and directions of the image magnification, the astigmatism, and the curvature of field can be adjusted by moving a toric lens such as a cylindrical lens along the optical axis or rotating it. Another possible method is to change the focal length of the toric lens itself, other than the above method of adjustment.

Meanwhile, let $\theta=0$ in order to estimate an amount of correction of maximum astigmatism when the cylindrical lens 2 shown in FIG. 2 is used. The maximum astigmatism in that case is given as follows.

$$AS2_{max}=-(d21)^2/(d21+f2) \qquad (13)$$

It was found that the maximum astigmatism amount $AS2_{max}$ to be corrected was not more than $10^{-5}L$ from results of repetitive trial printings and studies with a projection exposure apparatus for printing a line width of 10 or less microns where L was a distance between a reticle as the first object and a wafer as the second object.

Accordingly, supposing $d21 \leq 10^{-2}L$, $$|f2| \leq 10L \qquad (14)$$

from formula (13). The focal length of the positive cylindrical lens 2 preferably satisfies the above condition of the range in formula (14).

For a combination of two or more toric lenses such as the cylindrical lenses as shown in FIG. 1 and FIG. 2 or for a combination with another optical element, a new object point is defined at an image position in a noted direction, of an image formed by a first toric lens or another optical element from the object point of reticle 4, a distance is recalculated between the new object point and the next toric lens or another optical element, and the distance is put in d11 or d21.

Next studied is a case wherein the negative cylindrical lens 1 shown in FIG. 1 and the positive cylindrical lens 2 shown in FIG. 2 are arranged in series along the optical axis.

Here, if directions of generatrices of the two cylindrical lenses 1, 2 are coincident with each other and if a product of the image magnifications of the two cylindrical lenses is 1, that is, if $|\beta1\cdot\beta2|=1$, combined powers of the two cylindrical lenses 1, 2 in all directions become approximately zero, thus not changing the optical characteristics such as the magnification and off-axial aberrations (astigmatism, curvature of field, etc.) at all.

On the other hand, if the directions of generatrices of the two cylindrical lenses 1, 2 are perpendicular to each other, they produces a maximum magnification and maximum off-axial aberrations.

Accordingly, it is understood that adjustment can be achieved by relatively rotating the two cylindrical lenses 1, 2, for correction amounts or correction directions of asymmetric magnification error components and off-axial aberration components with directionality remaining in the projection optical system.

Where two negative cylindrical lenses 1 shown in FIG. 1 are arranged in series along the optical axis or where two positive cylindrical lenses 2 shown in FIG. 2 are arranged in series along the optical axis, the maximum magnification and maximum off-axial aberrations can be generated when the directions of generatrices of the respective cylindrical lenses are coincident with each other; whereas, they can have substantially the same lens effect as a single, rotationally symmetric, spherical lens, when the directions of generatrices of the respective cylindrical lenses are perpendicular to each other.

As described above, amounts and directions of the optical characteristics such as the magnification and off-axial aberrations (astigmatism, curvature of field, etc.) can be arbitrarily adjusted by using at least two cylindrical lenses each being a kind of toric lens and arranging at least one of the cylindrical lenses so as to be rotatable.

The above description mainly concerned the adjustment for the astigmatism and the curvature of field, but the adjustment of magnification error is next described in detail referring to FIG. 3 to FIG. 7 when the negative cylindrical lens 1 shown in FIG. 1 or the positive cylindrical lens 2 shown in FIG. 2 is rotated about the optical axis Ax.

Figure 3:
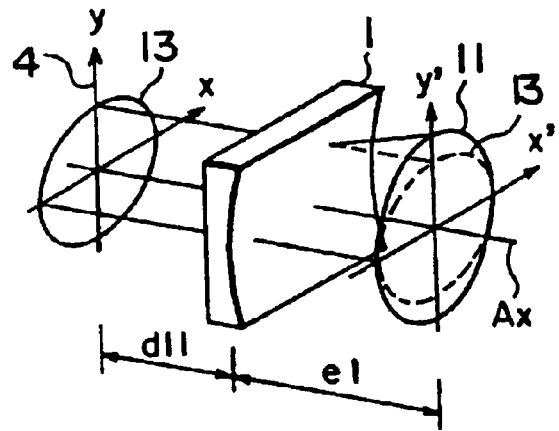
FIG. 3 is a drawing to show the effect by the negative cylindrical lens of FIG. 1.
Figure 5:
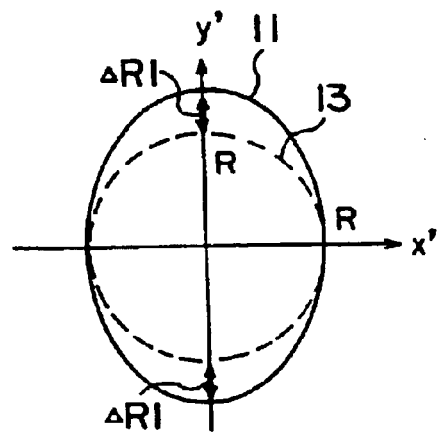
FIG. 5 is a plan view to show a state of beam cross section on a virtual plane shown in FIG. 3.

FIG. 3 shows a state when a bundle of parallel rays in radius R around the optical axis Ax are let to enter the negative cylindrical lens 1 shown in FIG. 1. Here, in FIG. 3, a circle 13 represents a locus when the bundle of parallel rays in radius R around the optical axis Ax pass the reticle surface 4 (xy plane), while an ellipse 11 a locus when a beam diverged by the cylindrical lens 1 from the bundle of parallel rays in radius R around the optical axis Ax, passes the virtual plane (x'y' plane). Also, FIG. 5 shows a state of beam size on the virtual plane (x'y' plane) shown in FIG. 3.

Figure 4:
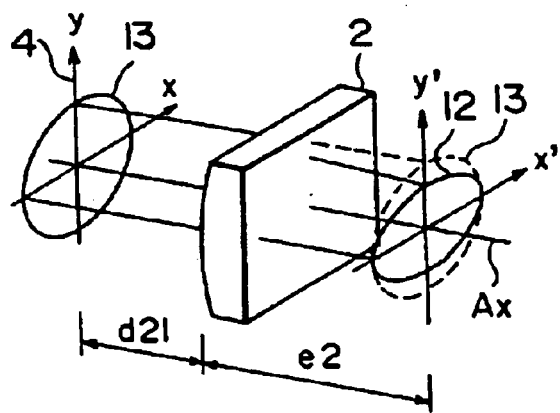
FIG. 4 is a drawing to show the effect by the positive cylindrical lens of FIG. 2.
Figure 6:
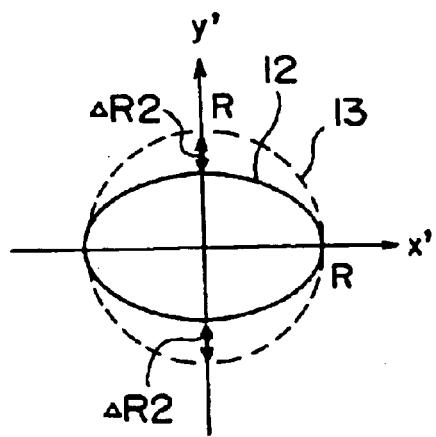
FIG. 6 is a plan view to show a state of beam cross section on a virtual plane shown in FIG. 4.

On the other hand, FIG. 4 shows a state when a bundle of parallel rays in radius R around the optical axis Ax are let to enter the positive cylindrical lens 2 shown in FIG. 2. Here, in FIG. 4, a circle 13 represents a locus when the bundle of parallel rays in radius R around the optical axis Ax pass the reticle surface 4 (xy plane), while an ellipse 12 a locus when a beam converged by the cylindrical lens 2 from the bundle of parallel rays in radius R around the optical axis Ax, passes the virtual plane (x'y' plane). Also, FIG. 6 shows a state of beam size on the virtual plane (x'y' plane) shown in FIG. 4.

When the cylindrical lens 1, 2 is rotated about the optical axis, the ellipse 11 in FIG. 3 or the ellipse 12 in FIG. 4 also rotates with the rotation.

Figure 7:
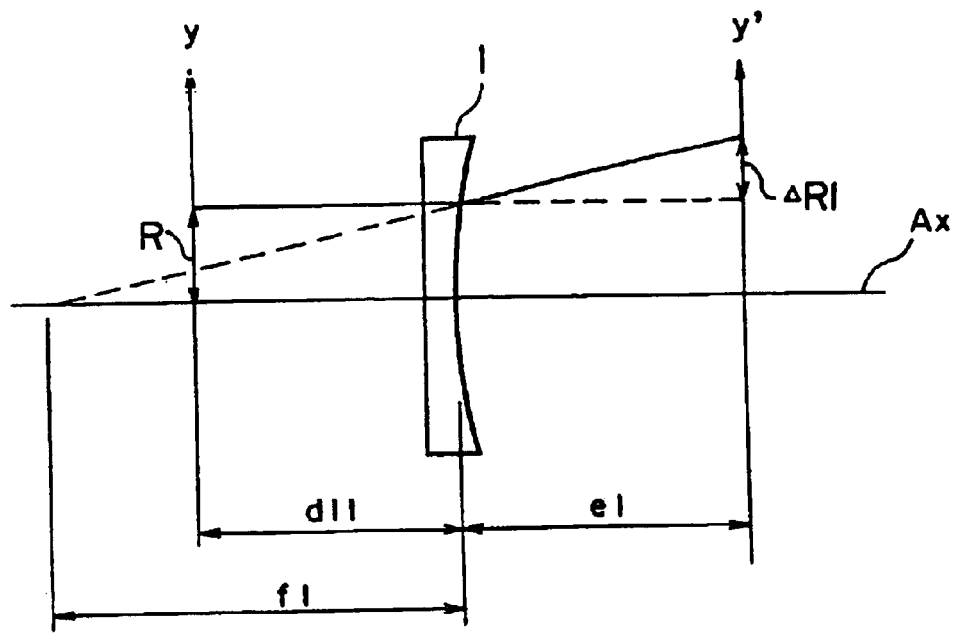
FIG. 7 is a drawing to show a geometrical-optic relation of the negative cylindrical lens shown in FIG. 3.

As shown in FIG. 7, letting $\Delta R_1$ be a change amount of the beam size in the y' direction (in the direction of a plane including the optical axis Ax and the y' axis) being the meridional direction on the virtual plane (x'y' plane) by the negative cylindrical lens 1, and e1 be a distance between the negative cylindrical lens 1 and the virtual plane (x'y' plane), the following relation holds.

$$\Delta R_1 = -R \cdot e_1 / f_1 \tag{15}$$

Figure 8:
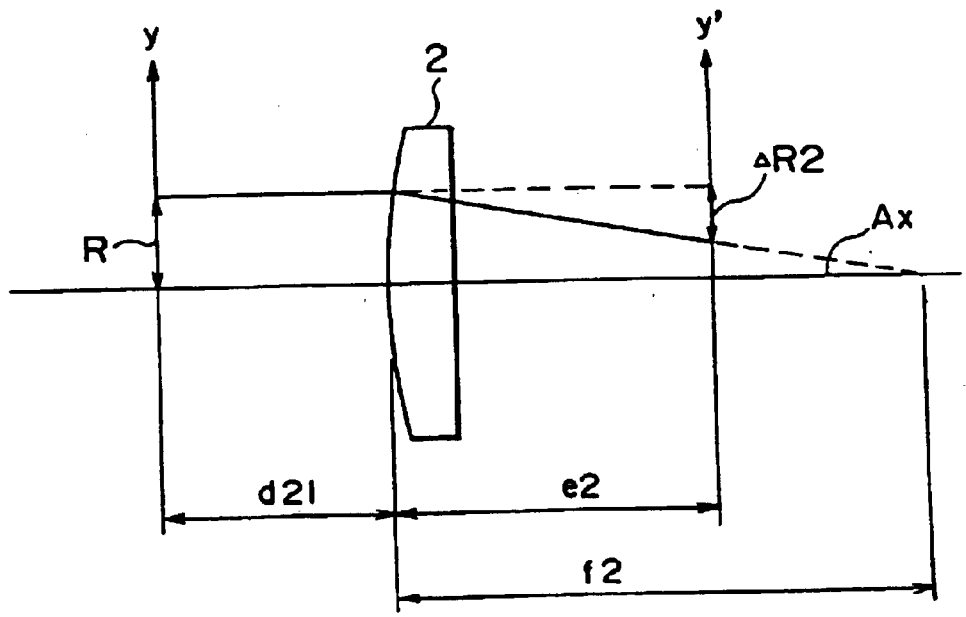
FIG. 8 is a drawing to show a geometrical-optic relation of the positive cylindrical lens shown in FIG. 4.

Similarly, as shown in FIG. 8, letting $\Delta R_2$ be a change amount of the beam size in the y' direction (in the direction of a plane including the optical axis Ax and the y' axis) being the meridional direction on the virtual plane (x'y' plane) by the positive cylindrical lens 2, and e2 be a distance between the positive cylindrical lens 2 and the virtual plane (x'y' plane), the following relation holds.

$$\Delta R_2 = -R \cdot e_2 / f_2 \tag{16}$$

As shown in FIG. 5 or FIG. 6, let $R_1$, $R_2$ be a y'-directional length (a half of the major axis in FIG. 5 or a half of the minor axis in FIG. 6) represented by a solid line on the virtual plane (x'y' plane). Then, they are given by the following formulas.

$$R_1 = R(1 - e_1/f_1) \tag{17}$$

$$R_2 = R(1 - e_2/f_2) \tag{18}$$

Since the x'-directional length is R in either case, the ellipse 11 and ellipse 12 indicated by the solid lines in FIG. 5 and in FIG. 6 can be expressed by the following formulas.

$$x'^2/R^2 + y'^2/[(1 - e_1/f_1) \cdot R]^2 = 1 \tag{19}$$

$$x'^2/R^2 + y'^2/[(1 - e_2/f_2) \cdot R]^2 = 1 \tag{20}$$

As described, where there is an asymmetric magnification error for example as shown in FIG. 6 inside the projection optical system, the beam size as shown in FIG. 6 can be arbitrarily changed from ellipse to circle by rotating the cylindrical lens 1 of FIG. 3 having the optical characteristics as shown in FIG. 5, whereby the asymmetric magnification error can be adjusted. Conversely, where there is an asymmetric magnification error for example as shown in FIG. 5 inside the projection optical system, the beam size as shown in FIG. 5 can be arbitrarily changed from ellipse to circle by rotating the cylindrical lens 2 of FIG. 4 having the optical characteristics shown in FIG. 6, whereby the asymmetric magnification error can be adjusted.

Here, when the negative cylindrical lens 1 as shown in FIG. 1 was used and when the distance is L between a reticle as the first object and a wafer as the second object, results of repetitive trial printings and studies with a projection exposure apparatus for printing a line width of 10 or less microns showed that a correction amount of maximum magnification error was preferably not more than $10^{-4}$ (=100 ppm).

Modifying the above formula (1) showing the relation between the focal length f1 of cylindrical lens 1 and the magnification $\beta_1$ of cylindrical lens 1, the following formula is obtained.

$$f_1 = (-d_{11} \cdot \beta_1)/(\beta_1 - 1) \tag{21}$$

Converting the above correction amount of maximum magnification error, $10^{-4}$ (=100 ppm), into $\beta_1$, $\beta_1 = 0.9999$ (or 1.0001). Accordingly, supposing $d_{11} \leq 10^{-2} L$, $$|f_1| \geq 10^2 L \tag{22}$$

from formula (21). Thus, it is preferred that the focal length of the negative cylindrical lens 1 satisfy the condition of the range of above formula (22).

The above description showed an example for correcting the magnification error by rotating a toric lens (cylindrical lens) about the optical axis, but it is apparent from the above formulas (1), (3), (6), and (8) that the magnification error can also be corrected by shifting a toric lens (cylindrical lens) along the optical axis. In this case, it is more preferable that the above formula (22) be satisfied.

Incidentally, the above description concerned that the magnification error was able to be corrected using a toric lens (cylindrical lens), but amounts and directions of the optical characteristics such as the magnification error can also arbitrarily be adjusted by using at least two cylindrical lenses each being a kind of toric lens and arranging at least one of the cylindrical lenses so as to be rotatable.

Thus, a possible arrangement is such that the negative cylindrical lens 1 shown in FIG. 1 and the positive cylindrical lens 2 shown in FIG. 2 are arranged in series along the optical axis of the projection optical system and that they are arranged as rotatable relative to each other. In this case, because the negative cylindrical lens 1 has the optical characteristics as shown in FIG. 5 and the positive cylindrical lens 1 has the optical characteristics as shown in FIG. 6, it is understood that a beam size formed by these cylindrical lenses (1, 2) becomes a combination of the beam sizes shown in FIG. 5 and FIG. 6 and that the combined beam size can be arbitrarily changed from ellipse to circle by relatively rotating them, whereby the asymmetric magnification error can be corrected.

Further, where the projection optical system has the asymmetric magnification error for example as shown in FIG. 5 or FIG. 6, the beam size as shown in FIG. 5 or FIG. 6 can be arbitrarily changed from ellipse to circle by arranging at least two or more cylindrical lenses in series along the optical axis and arranging at least one of the cylindrical lenses as rotatable, thereby enabling to adjust the asymmetric magnification error.

Where two or more toric lenses (cylindrical lenses) are combined or where a toric lens is combined with another optical element, pursuit may be done under such an assumption that a light beam obtained when a noted beam passes the first toric lens (cylindrical lens) or another optical element, is considered as a new beam and that the new beam enters the next toric lens (cylindrical lens) etc.

In a combination of two toric lenses (cylindrical lenses), where the negative cylindrical lens 1 as shown in FIG. 1 and the positive cylindrical lens 2 as shown in FIG. 2 are set as close to each other, the total lens power in each direction becomes nearly zero, thus, the beam shape is not changed, when the directions of generatrices of the lenses are coincident with each other; whereas, a change of the shape becomes maximum, when the directions of generatrices of the lenses are perpendicular to each other.

Further, where two negative cylindrical lenses 1 as shown in FIG. 1 are arranged in series along the optical axis, or where two positive cylindrical lenses 2 as shown in FIG. 2 are arranged in series along the optical axis, a maximum magnification and maximum off-axial aberrations can be generated when the directions of generatrices of the cylindrical lenses are coincident with each other; whereas, they can have the same lens effect as a single, rotationally symmetric, spherical lens, when the directions of generatrices of the cylindrical lenses are perpendicular to each other.

As described, using at least two cylindrical lenses each being a kind of toric lens and arranging at least one of them as rotatable, amounts and directions of the optical characteristics such as the magnification and off-axial aberrations (astigmatism, curvature of field, etc.) can be arbitrarily adjusted.

The above formula (14) and formula (22) can be expressed in a general form as follows, where fA is a focal length of a cylindrical lens effective for correction of astigmatism and fD a focal length of a cylindrical lens effective for correction of magnification error.

$$|fA| \geq 10L \quad (23)$$

$$|fD| \geq 10^2 L \quad (24)$$

It is a preferred that the about formula (23) be satisfied for effectively correcting the astigmatism, and that the above formula (24) be satisfied for effectively correcting the magnification error. It should be, however, noted that the focal length (fA, fD) of cylindrical lens in this case is not limited to a single cylindrical lens, but may be applied to a combination of a plurality of toric lenses such as cylindrical lenses, or toric reflecting members. Namely, the focal length (fA, fD) of cylindrical lens becomes a combined focal length of the plurality of cylindrical lenses in the case of a combination of the plurality of toric optical members.

Outside the relation of formula (23) or formula (24), a toric component is too strong, which affects other aberrations causing a problem. For example, in the case of correction of astigmatism, the curvature of field or the magnification error is degraded, or in the case of correction of magnification error, the telecentricity or the astigmatism is degraded. Therefore, the correction of asymmetric aberrations can be effectively made within the above ranges.

Incidentally, the above formula (23) or formula (24) showed the range of optimum focal length of toric optical member, and further the range of optimum focal length of toric optical member is next studied from another point of view.

Figure 9:
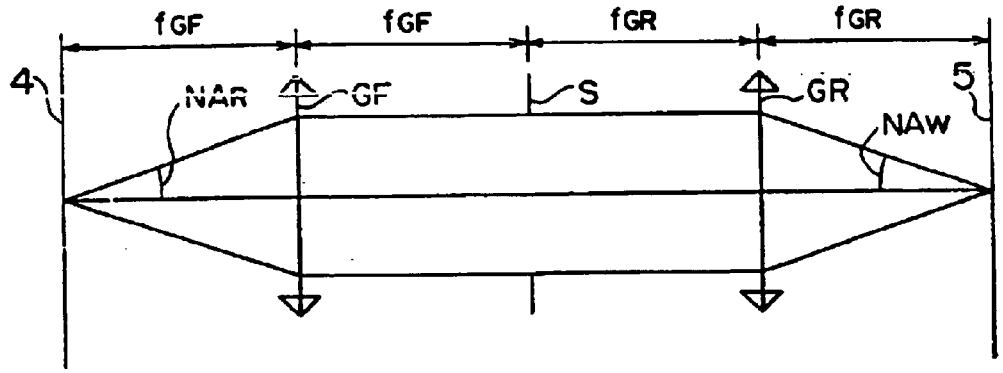
FIG. 9 is a drawing to show a geometrical-optic relation of a projection optical system.

First, FIG. 9 shows a projection optical system having a front group GF on the reticle 4 side and a rear group GR on the wafer 5 side with an aperture stop S in-between. Here, the front group GF has a focal length of $f_{GF}$ and the rear group GR a focal length of $f_{GR}$. The projection optical system is telecentric both on the reticle side and on the wafer side.

Figure 10:
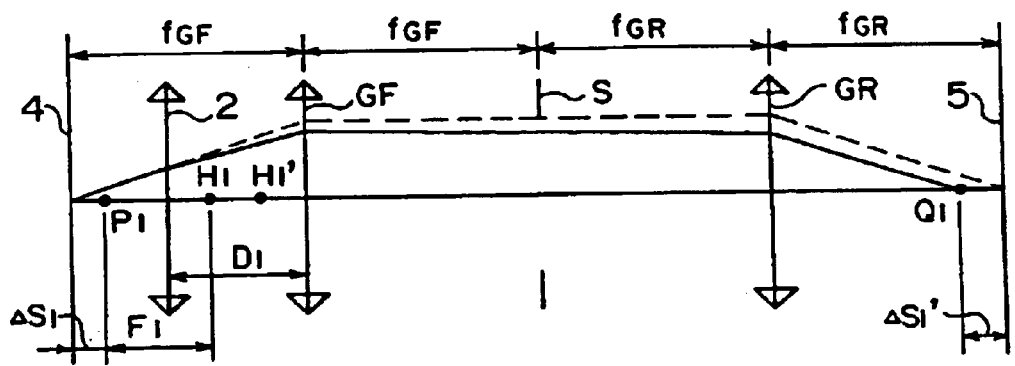
FIG. 10 is a drawing to show a geometrical-optic relation where a cylindrical lens as a toric lens is placed between the projection optical system shown in FIG. 9 and a reticle.

FIG. 10 shows a state where a cylindrical lens having a positive power as a toric optical member is placed between the front group GF in the projection optical system shown in FIG. 9, and the reticle 4. The power of the cylindrical lens 2 is present in the direction of the plane of FIG. 10 (or in the meridional direction).

As shown in FIG. 10, letting f2 be a focal length of cylindrical lens 2 and $D_1$ be a distance between the cylindrical lens 2 and the front group GF (a distance between the principal points of the two optical systems), a combined focal length $F_1$ of the cylindrical lens 2 and the front group GF is given by the following relation.

$$F_1 = (f2 \cdot f_{GF})/(f2 + f_{GF} - D_1) \quad (25)$$

Also, letting $B_1$ be an image magnification of the projection optical system (GF, GR) and $B_1'$ be an image magnification of the combined system of the cylindrical lens 2 and the projection optical system (GF, GR), the following relations hold.

$$B_1 = -f_{GR}/f_{GF} \quad (26)$$

$$B_1' = -f_{GR}/F_1 = B_1[1 + (f_{GF} - D_1)/f2] \quad (27)$$

Accordingly, a magnification difference $\Delta B_1$ between magnifications in the sagittal direction and in the meridional direction of the projection optical system is given as follows.

$$\Delta B_1 = B_1' - B_1 = B_1(f_{GF} - D_1)/f2 \quad (28)$$

On the other hand, letting $H_1$ be the reticle-side principal point by the combined system of the cylindrical lens 2 and the front group GF, $P_1$ be a reticle-side focus position by the combined system of the cylindrical lens 2 and the front group GF, $\Delta s_1$ be a distance between the focus position $P_1$ and the reticle 4, and $\Delta s_1'$ be a distance between the wafer 5 and a position $Q_1$ of an image of reticle 4 by the combined system of the cylindrical lens 2 and the projection optical system (GF, GR), the following relations hold.

$$\Delta s_1 = (f_{GF} - D_1)^2/(f2 + f_{GF} - D_1) \quad (29)$$

$$\Delta s_1' = (B_1')^2 \cdot \Delta s_1 \quad (30)$$

Here, $\Delta s_1'$ means a difference between image positions in the sagittal direction and in the meridional direction of the projection optical system, that is, an astigmatism amount (astigmatic difference).

Also, letting $NA_R$ be a reticle-side numerical aperture of the projection optical system and $\lambda$ be a wavelength of exposure light, a depth of focus $DOF_R$ on the reticle side of the projection optical system is as follows.

$$DOF_R = \lambda/(NA_R) \tag{31}$$

Then, in order to control the astigmatism amount within the reticle-side depth of focus, the following formula is derived from the above formulas (29) and (31).

$$f2 \geq -(f_{GF}-D_1) + [(NA_R)^2(f_{GF}-D_1)^2]/\lambda \tag{32}$$

Therefore, it is preferred that the cylindrical lens 2 be constructed so as to satisfy formula (32), whereby the astigmatism amount can be controlled within the depth of focus.

The following formula is a general expression of formula (32), where $\Delta f$ is a power difference in orthogonal directions of the toric optical member.

$$\Delta f \geq |-(f_{GF}-D_1) + [(NA_R)^2(f_{GF}-D_1)^2]/\lambda| \tag{33}$$

It is thus understood that the above formula (33) should be preferably satisfied in use of a toric optical member in order to control the astigmatism amount by this member within the reticle-side depth of focus of the projection optical system. It is needless to mention that the above relations of formulas (32) and (33) hold for any of projection optical systems having 1:1, reduction, or enlargement magnification.

As an example, suppose the reticle-side numerical aperture $NA_R$ of the projection optical system is 0.1, the wavelength $\lambda$ of exposure light is 436 nm, $f_{GF}$=250 mm, $f_{GR}$=250 mm, and $D_1$=200 mm. From the above formula (32), the focal length f2 in the meridional direction, of the cylindrical lens (generally speaking, from above formula (33), the power difference $\Delta f$ in orthogonal directions of toric optical member) is not less than $5.7 \times 10^4$ mm, and a magnification correction amount (magnification difference $\Delta B_1$) which can be variable in this case becomes not more than 870 ppm ($=8.7 \times 10^{-4}$).

In the above description, formula (33) was derived assuming that the toric optical member was disposed between the reticle and the projection optical system, but, because the same relation holds even where the toric optical member is placed between the projection optical system and the wafer, the following relation should be preferably satisfied in that case.

$$\Delta f \geq |-(f_{GR}-D_1') + [(NA_W)^2(f_{GR}-D_1')^2]/\lambda| \tag{34}$$

Here, $NA_W$ is the wafer-side numerical aperture of the projection optical system, and $D_1'$ is a distance between the toric optical member and the rear group GR (a distance between the principal points of the two optical systems).

Figure 11:
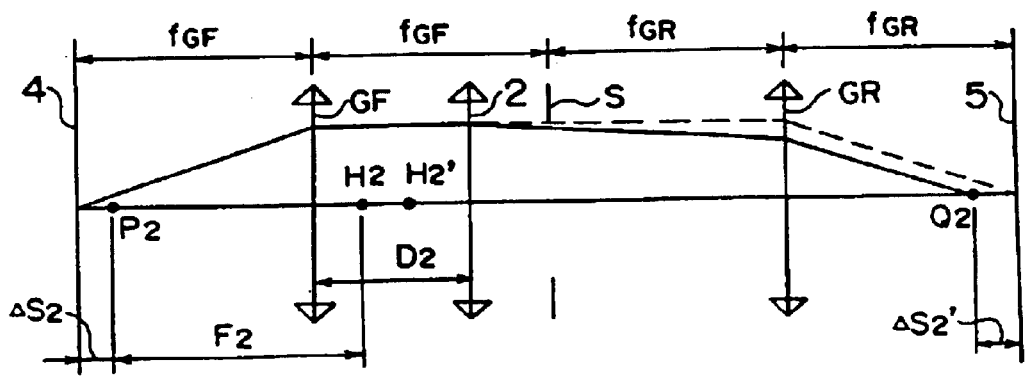
FIG. 11 is a drawing to show a geometrical-optic relation where a cylindrical lens as a toric lens is placed in the vicinity of the pupil of the projection optical system shown in FIG. 9.

Next studied referring to FIG. 11 is the range of optimum focal length of cylindrical lens 2 where a positive cylindrical lens 2 is placed between the front group GF and the rear group GR in the projection optical system, in other words, in the vicinity of the aperture stop S.

FIG. 11 shows a state where a cylindrical lens 2 having a positive power as a toric optical member is placed between the front group GF and the rear group GR in the projection optical system shown in FIG. 9. The power of the cylindrical lens 2 is present in the direction of the plane of FIG. 11 (or in the meridional direction).

Here, as shown in FIG. 11, letting f2 be a focal length of the cylindrical lens 2 and $D_2$ be a distance between the front group GF and the cylindrical lens 2 (a distance between the principal points of the two optical systems), the following relation holds for a combined focal length $F_2$ of the front group GF and the cylindrical lens 2.

$$F_2 = (f2 \cdot f_{GF})/(f2 + f_{GF} - D_2) \tag{35}$$

Also, letting $B_2$ be an image magnification of the projection optical system (GF, GR) and $B_2'$ be an image magnification of the combined system of the cylindrical lens 2 and the projection optical system (GF, GR), the following relations hold.

$$B_2 = f_{GF}/f_{GF} \tag{36}$$

$$B_2' = -f_{GR}/F_2 = B_2[1+(f_{GF}-D_2)/f2] \tag{37}$$

Accordingly, a magnification difference $\Delta B_2$ between the magnifications in the sagittal direction and in the meridional direction of the projection optical system is as follows.

$$\Delta B_2 = B_2' - B_2 = B_2(f_{GF}-D_2)/f2 \tag{38}$$

On the other hand, letting $H_2$ be the reticle-side principal point by the combined system of the front group GF and the cylindrical lens 2, $P_2$ be a reticle-side focus position by the combined system of the front group GF and the cylindrical lens 2, $\Delta s_2$ be a distance between the focus position $P_2$ and the reticle 4, and $\Delta s_2'$ be a distance between the wafer 5 and a position $Q_2$ of an image of reticle 4 by the combined system of the projection optical system (GF, GR) and the cylindrical lens 2, the following relations hold.

$$\Delta s_2 = (f_{GF})^2/(f2 + f_{GF} - D_2) \tag{39}$$

$$\Delta s_2' = (B_2')^2 \cdot \Delta s_2 \tag{40}$$

Here, $\Delta s_2'$ means a difference between image positions in the sagittal direction and in the meridional direction of the projection optical system, that is, an astigmatism amount (astigmatic difference).

Then, in order to control the astigmatism amount within the reticle-side depth of focus of the projection optical system, the following formula is derived from the above formulas (31) and (39).

$$f2 \geq -(f_{GF}-D_2) + [(NA_R)^2(f_{GF})^2]/\lambda \tag{41}$$

Accordingly, the cylindrical lens 2 is preferably constructed so as to satisfy formula (41), whereby the astigmatism amount can be controlled within the depth of focus.

The following formula presents a general expression of formula (41) as a power difference $\Delta f$ in orthogonal directions of the toric optical member.

$$\Delta f \geq |-(f_{GF}-D_2) + [(NA_R)^2(f_{GF})^2]/\lambda| \tag{42}$$

It is thus understood that the above formula (42) should be preferably satisfied in use of a toric optical member in order to control the astigmatism amount by this member within the reticle-side depth of focus of the projection optical system. It is needless to mention that the above relations of formulas (41) and (42) hold for any of projection optical systems having 1:1, reduction, or enlargement magnification.

As an example, suppose the reticle-side numerical aperture $NA_R$ of the projection optical system is 0.1, the wavelength $\lambda$ of exposure light is 436 nm, $f_{GF}$=250 mm, $f_{GB}$=250 mm, and $D_2$=200 mm. From the above formula (41), the focal length f2 in the meridional direction, of the cylindrical lens (generally speaking, from above formula (42), the power difference Δf in orthogonal directions of toric optical member) is not less than $1.43 \times 10^6$ mm, and a magnification correction amount (magnification difference $\Delta B_1$) which can be variable in this case becomes not more than 35 ppm ($=3.5 \times 10^{-5}$).

From the results of the above analysis with FIG. 9 to FIG. 11, where the toric optical member is placed between the reticle and the projection optical system or between the projection optical system and the wafer, the contribution of correction to the magnification error can be increased while suppressing the contribution of correction to the astigmatism; while, where the toric optical member is placed at or near the pupil of the projection optical system, the contribution of correction to the astigmatism can be increased while suppressing the contribution of correction to the magnification error.

The toric optical member stated in the present invention may be replaced by a toric lens having different powers in orthogonal directions, obtained by polishing a rotationally symmetric spherical surface more in one direction. A projection optical system using such a toric lens will be described herein later. Further, the toric optical member may be a reflecting mirror having different powers in orthogonal directions, or a distributed index lens having different powers in orthogonal directions.

Incidentally, the above description concerned the correction of rotationally asymmetric aberrations such as the astigmatism, the curvature of field, the magnification error, etc. using the toric optical member having different powers in orthogonal directions as an aspherical surface rotationally asymmetric with respect to the optical axis of the projection optical system. If rotationally asymmetric magnification error components or distortion components locally remaining at random appear in the projection optical system in addition to these aberrations and magnification error appearing on a rotationally asymmetric basis, processing such as polishing is locally applied to a lens surface of a cylindrical lens as a kind of toric optical member slidable along the optical axis or rotatable about the optical axis. Locating the thus processed cylindrical lens between the reticle and the wafer, the magnification error components and distortion components appearing at random can be corrected in addition to the correction of the astigmatism, the curvature of field, and the magnification error appearing on a rotationally asymmetric basis.

Further, where the projection optical system has only the magnification error components or distortion components locally remaining at random on a rotationally asymmetric basis, the magnification error components or distortion components appearing at random can be corrected by applying local processing such as polishing to an optical element (lens or reflecting mirror) itself constituting the projection optical system.

Also, where the projection optical system has only the magnification error components or distortion components locally remaining at random on a rotationally asymmetric basis, the magnification error components or distortion components appearing at random can be corrected by such an arrangement that a plane-parallel plate having a certain thickness is subjected to local processing such as polishing and that the thus machined plane-parallel plate is placed either between the reticle and the projection optical system, inside the projection optical system, or between the projection optical system and the wafer. In this case, a spherical aberration appears because the plane-parallel plate has the certain thickness. Then, the projection optical system can be preliminarily arranged so as to correct the spherical aberration.

Figure 12:
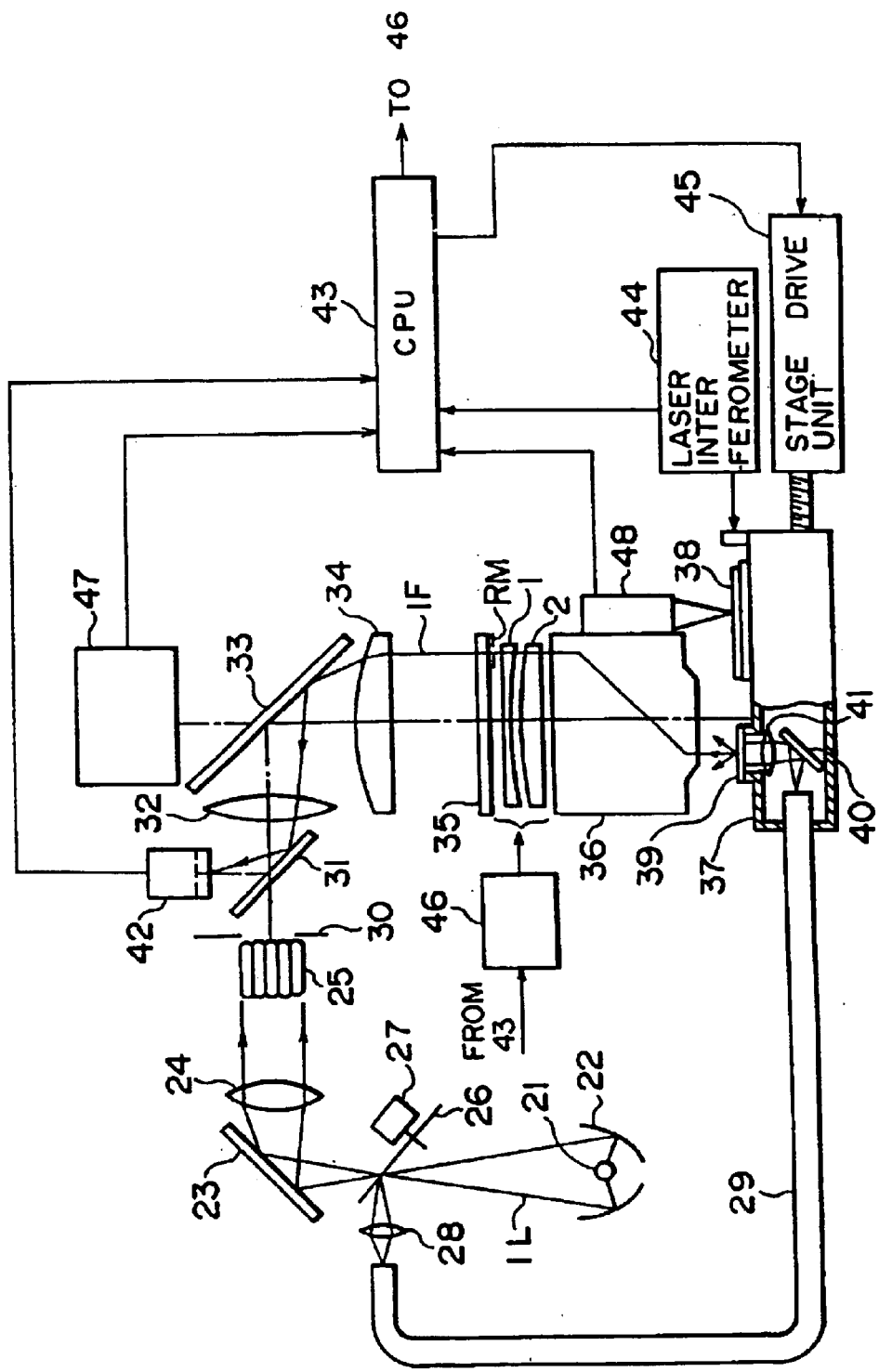
FIG. 12 is a drawing to show the overall structure of an embodiment according to the present invention.

An embodiment of the present invention is next described in detail referring to FIG. 12.

FIG. 12 shows the structure of a projection exposure apparatus according to the embodiment of the present invention. As shown in FIG. 12, a reticle 35 held on a reticle stage not shown is set above a both-side (or single-side) telecentric projection lens 36, and a toric optical member having different powers in orthogonal directions is provided as optical means having rotationally asymmetric powers with respect to the optical axis of the projection lens 36 between the reticle 35 and the projection lens 36. This toric optical member has, in order from the reticle side, a negative cylindrical lens 1 having a concave surface facing the projection lens and a negative power in the direction of the plane of the drawing, and a positive cylindrical lens 2 having a convex surface facing the reticle and a positive power in the direction of the plane of the drawing, wherein the cylindrical lens 1 and cylindrical lens 2 each are arranged as rotatable about the optical axis of the projection lens 36.

Further, a wafer 38 mounted on a wafer stage 37 is set at a position conjugate with the reticle 35 with respect to the projection lens 36, and the wafer stage 37 is composed of a two-dimensionally movable XY stage and a Z stage movable along the optical axis of the projection lens 36.

Above the reticle 35 there is an illumination optical system 21, 22, 23, 24, 25, 32, 33, 34 for uniformly illuminating the reticle 35 by Köhler illumination, and the illumination optical system includes a measurement system 42 for measuring the optical characteristics of the projection lens, and a first alignment system 47 for optically performing detection of relative position between the reticle 35 and the wafer 38 with light of the same wavelength as exposure light IL described below.

Also, an off-axis type second alignment system 48 is set outside the projection lens 36, and the second alignment system 48 optically detects a position of the wafer 38 with light of a wavelength different from the exposure light IL described below.

Specifically describing the embodiment shown in FIG. 12, the exposure light IL emitted from a light source 21 such as a mercury lamp is collected by an ellipsoidal mirror 22, then is reflected by a reflection mirror 23, thereafter is converted into a bundle of nearly parallel rays by a collimator lens 24, and is incident into an optical integrator 25 consisting of a fly's eye lens. A shutter 26 is provided near the second focus of the ellipsoidal mirror 22, and the illumination light IL can be arbitrarily interrupted by rotating the shutter 26 through a drive unit 27 such as a motor.

When the exposure light IL is interrupted by the shutter 26, the illumination light IL reflected by the shutter 26 is guided in the direction approximately perpendicular to the optical axis of the ellipsoidal mirror 22. The thus guided exposure light IL is put into one end of a light guide 29 by a condenser lens 28. Accordingly, the exposure light IL emitted from the light source 21 enters either the optical integrator 25 or the light guide 29.

When the exposure light IL is incident into the optical integrator 25, there are a lot of secondary light source images (hereinafter simply referred to as secondary light sources) formed on the reticle-side focal plane of the optical integrator 25. A variable aperture stop 30 is set on the plane where the secondary light sources are formed. The exposure light IL emitted from the secondary light sources passes through a half mirror 31 inclined at 45° relative to the optical axis, and thereafter travels via a first condenser lens 32, a dichroic mirror 33, and a second condenser lens 34 to illuminate a pattern area on the lower surface of reticle 35 with uniform illuminance.

Upon exposure an image of the pattern on the reticle 35 is formed on the wafer 38 through the toric optical member 1, 2 and the projection lens 36. In this case, because the secondary light source plane of the optical integrator 25 is conjugate with the pupil plane of the projection lens 36, the a value indicating coherency of the illumination optical system illuminating the reticle 35 can be changed by adjusting an aperture of the variable aperture stop 30 set on the secondary light source plane. When a maximum incident angle of the exposure light IL illuminating the reticle 35 is $\theta_{IL}$ and a half angular aperture of the projection lens 36 on the reticle 35 side is $\theta_{PL}$, the σ value can be expressed by sin $\theta_{IL}$/sin $\theta_{PL}$. Here, the a value is set in the range of about 0.3 to 0.7.

Although not shown, an aperture stop is provided at the pupil position of the projection lens 36, and an aperture of the aperture stop may be arranged as variable.

An adjustment plate 39 made for example of a glass plate is fixed near a wafer holder of wafer stage 37, and a reference pattern is formed on the surface on the projection lens 36 side, of the adjustment plate 39. Corresponding to it, a reticle mark RM is formed at a position conjugate with the reference pattern on the adjustment plate 39 with respect to the projection lens 36, within an image field of projection lens 36 and near the pattern area of reticle 35. As an example, the reference pattern on the adjustment plate 39 is a cross aperture pattern formed in a light shield portion, while the reticle mark RM on the wafer 35 is a pattern obtained by inverting the light and dark portions in a pattern obtained by multiplying the reference pattern by a projection magnification of the toric optical member 1, 2 and projection lens 36.

A condenser lens 41 and a reflective mirror 40 are set below the adjustment plate 39 of wafer stage 37, and an exit end of the light guide 29 is fixed at the rear focal plane of condenser lens 41. Since the surface of the exit end of the light guide 29 is conjugate with the pupil plane of projection lens 36, it is also conjugate with the variable aperture stop 30. Also, because the emission surface at the exit end of the light guide 29 is sized so that the size of an image projected onto the variable aperture stop 30 is nearly equal to the aperture of variable aperture stop 30, the reference pattern on the adjustment plate 39 is illuminated at an illumination a value nearly equal to that for exposure light IL. Further, in the illumination optical system of exposure light IL, a light-receiving portion of photomultiplier 42 is set at a position conjugate with the variable aperture stop 30 with respect to the half mirror 31. Namely, the light-receiving portion of photomultiplier 42 is arranged as conjugate with the pupil plane of projection lens 36 and with the plane of the exit end of light guide 29. A detection surface of the light-receiving portion is sized larger than an image of the light-emitting surface of the exit end of the light guide 29 projected thereon, thereby preventing a light quantity loss. Therefore, when the reference pattern on the adjustment plate 39 is illuminated from the bottom side, most of light emerging from the reference pattern on the adjustment plate 39 enters the projection lens 36 and toric optical member 1, 2 no matter where the adjustment plate 39 is located in the image field of projection lens 36, thus impinging on the light-receiving surface of photomultiplier 42 through the reticle mark RM on reticle 35.

A central processing unit 43 (hereinafter referred to as CPU) is electrically connected to the photomultiplier 42, and photoelectrically converted signals output from the photomultiplier 42 are supplied to CPU 43. A mirror for X direction and a mirror for Y direction not shown are fixed on the upper surface of wafer stage 37, and, therefore, coordinates of a position on the wafer stage 37 can be always monitored using a laser interferometer 44 and the two mirrors. The coordinate information from the wafer stage 37 is supplied through the laser interferometer 44 to CPU 43, and the CPU 43 can move the wafer stage 37 to a desired coordinate position through a stage drive unit 45.

Figure 13:
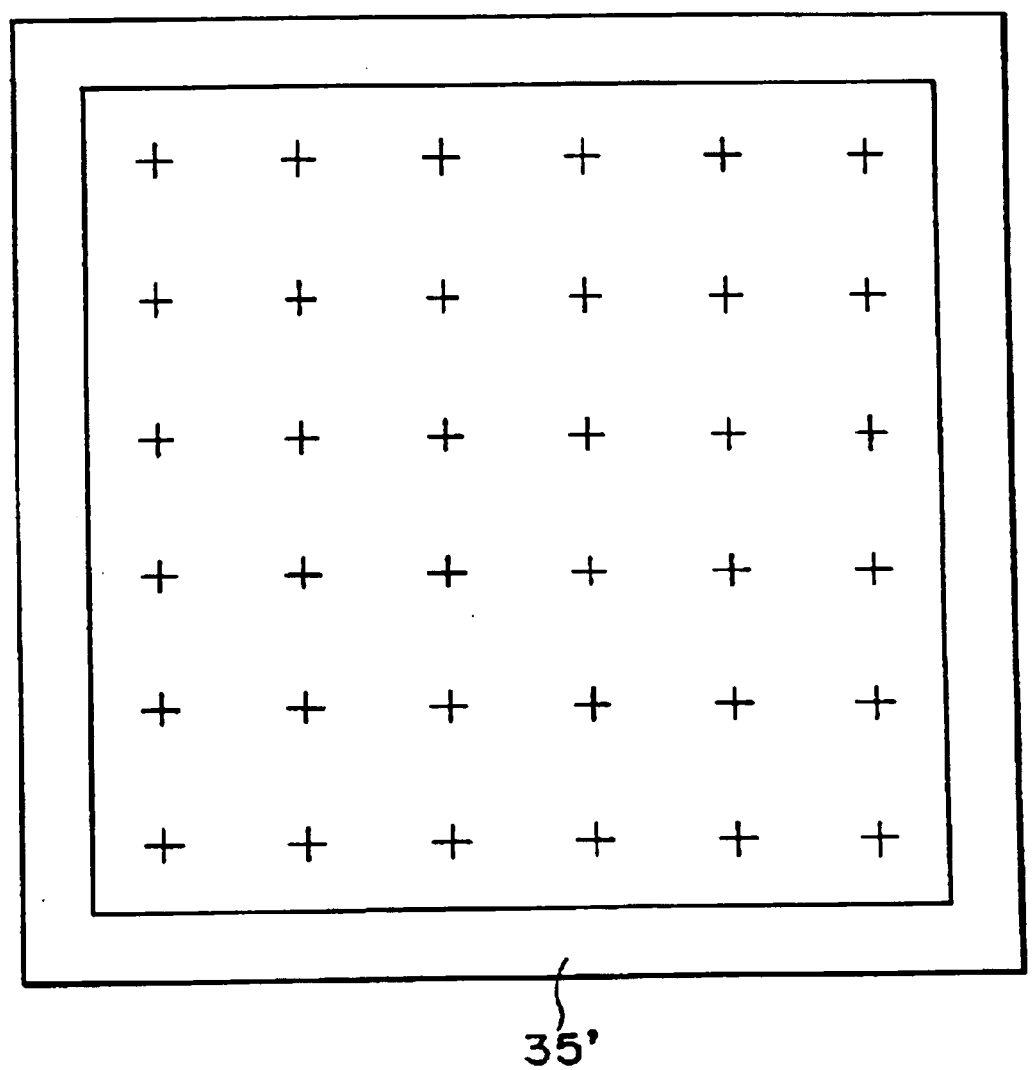
FIG. 13 is a plan view to show the structure of a reference reticle.

The operation of the present embodiment is next described. For measuring the rotationally asymmetric optical characteristics (astigmatism, curvature of field, magnification error, distortion) rotationally asymmetric with respect to the optical axis of the projection optical system and remaining in the projection lens 36 and toric optical member 1, 2 because of assembling errors etc., a reference reticle 35' as shown in FIG. 13 is preliminarily set on the unrepresented reticle stage. As shown in FIG. 13, light-shielding patterns of cross chromium or the like are arranged at predetermined intervals on a two-dimensional basis in a pattern area of the reference reticle 35'.

After intercepting the exposure light IL by the shutter 26 through the drive unit 27, CPU 43 moves the adjustment plate 39 on the wafer stage 37 into the image field of projection lens 36 through the stage drive unit 45. By this, the exposure light IL (hereinafter simply referred to as illumination light) reflected-by the shutter 26 is led through the condenser lens 28 and the light guide 29 into the wafer stage 37. After reflected by the reflective mirror 40, the illumination light is converted into a bundle of nearly parallel rays by the condenser lens 41 so as to illuminate the reference pattern formed on the adjustment plate 39 from the bottom side. The reference pattern on the adjustment plate 39 is projected through the projection lens 36 and toric optical member 1, 2 onto the light-shielding patterns of reference reticle 35', and the photomultiplier 42 photoelectrically detects a matching condition between the two patterns through the second condenser lens 34, the dichroic mirror 33, the first condenser lens 32, and the half mirror 31. Then, in order to successively detect coordinates of positions of plural light-shielding patterns two-dimensionally arranged in the reference reticle 35' through the photomultiplier 42, CPU 43 successively moves the wafer stage 37 through the wafer drive unit 45 while always monitoring the coordinate position of the wafer stage 37 through the laser interferometer 44. By this, the photomultiplier 42 photoelectrically detects respective matching conditions of the reference pattern on the adjustment plate 39 with the plural light-shielding patterns two-dimensionally arranged in the reference reticle 35', and CPU 43 successively stores the coordinate positions when matched, in a first memory unit not shown in CPU 43 through the laser interferometer 44. Further, CPU 43 has a second memory unit and a first correction amount calculating unit inside, not shown, wherein the second memory unit preliminarily stores correlational information about relations between the optical characteristics (astigmatism, curvature of field, magnification error, distortion) rotationally asymmetric with respect to the optical axis of projection optical system and relative rotation amounts of toric optical member 1, 2. Accordingly, the first correction amount calculating unit calculates an optimum amount of relative rotation for the toric optical member 1, 2 to correct, based on information from the first and second memory units. Then, based on the correction information from the first correction amount calculating unit, CPU 43 outputs a drive signal to the drive unit 46 such as a motor, so that the drive unit 46 relatively rotates the toric optical member 1, 2 by the determined correction amount (rotation amount).

After completion of the above operation, a normal reticle 35 used in actual process is set on the reticle stage not shown, and CPU 43 changes over the shutter 26 through the drive unit 27. By this, the exposure light IL illuminates the reticle 35 through the illumination optical system, whereby an image of the pattern on the reticle 35 is faithfully transferred through the toric optical member 1, 2 and projection lens 36 onto the wafer 38. Continuous exposure transfer with the projection exposure apparatus as described could accumulate thermal energy due to the exposure light IL in the projection lens 36, which would change the optical characteristics of projection lens 36. Thus, during operations of exposure transfer, the optical characteristics of projection lens 36 are periodically measured as described above and the toric optical member 1, 2 is rotated based on the measurement results. On this occasion, it is more preferable that the above adjustment be used in combination with the well-known technique to adjust the magnification of the projection lens 36 itself by controlling the pressure between constituent lenses of the projection lens 36.

It is to be desired that it is checked whether the rotationally asymmetric optical characteristics (astigmatism, curvature of field, magnification error, distortion) remaining in the projection lens 36 are corrected in a perfectly optimized state by an amount of relative rotation of the toric optical member 1, 2. In this case, more perfect correction can be achieved by repeating the above-described operations.

In measuring the magnification error and distortion remaining-in the projection lens 36, the wafer stage 37 is two-dimensionally moved to obtain coordinate positions of the respective light-shielding patterns in the reference reticle 35'. In more accurately measuring the astigmatism and curvature of field remaining in the projection lens 36, coordinate positions of the respective light-shielding patterns in the reference reticle 35' are obtained so as to maximize the contrast of an output signal from the photomultiplier 42 while moving the wafer stage 37 along the optical axis of the projection lens 36.

The projection exposure apparatus of the present embodiment is fully effective for nonlinear extension or contraction of wafer 38 in the semiconductor fabrication process etc., or for cases where semiconductors are fabricated by a plurality of projection exposure apparatus and there are differences of magnification error and distortion between the projection exposure apparatus. Specifically, first, in order to successively optically detect coordinate positions of plural wafer marks formed on the wafer through the second alignment system 48 set outside the projection lens 36, CPU 43 successively moves the wafer stage 37 through the stage drive unit 45 while always monitoring the coordinate position of wafer stage 37 through the laser interferometer 44. By this, CPU 43 successively stores the coordinate positions of respective wafer marks formed on the wafer, as obtained from the second alignment system 48 and laser interferometer 44, in a third memory unit not shown inside CPU 43. Further, CPU 43 has a fourth memory unit and a second correction amount calculating unit inside, not shown, wherein the fourth memory unit preliminarily stores correlational information about relations between the optical characteristics (astigmatism, curvature of field, magnification error, distortion) rotationally asymmetric with respect to the optical axis of projection optical system and amounts of relative rotation of the toric optical member 1, 2. Accordingly, the second correction amount calculating unit calculates an optimum amount of relative rotation for the toric optical member 1, 2 to correct, based on the information from the third and fourth memory units. Then, based on the correction information from the correction amount calculating unit, CPU 43 outputs a drive signal to the drive unit 46 such as a motor, so that the drive unit 46 relatively rotates the toric optical member 1, 2 by the determined correction amount (rotation amount).

Although the above embodiment shown in FIG. 12 showed an example to correct the rotationally asymmetric optical characteristics (astigmatism, curvature of field, magnification error, distortion) remaining in the projection lens 36 by an amount of relative rotation of the toric optical member 1, 2, it is needless to mention that the correction may be made by relatively moving the toric optical member 1, 2 along the optical axis of projection lens 36. Also, the embodiment of FIG. 12 showed an example to automatically correct the rotationally asymmetric optical characteristics (astigmatism, curvature of field, magnification error, distortion) remaining in the projection lens 36, but the rotation or movement of the toric optical member 1, 2 can be manually performed.

Further, the light source 21, ellipsoidal mirror 22, and collimator lens 24 in the present embodiment may be replaced by a laser light source such as an excimer laser etc. for supplying a bundle of parallel rays. Moreover, this laser may be combined with a beam expander for converting the laser light into a light beam having a selected beam cross section.

The embodiment shown in FIG. 12 showed an example in which the toric optical member 1, 2 is placed between the reticle and the projection lens, but the present invention is by no means limited to this arrangement. For example, arrangements as shown in FIGS. 14A to 14F may also be employed.

FIG. 14A shows an example in which the toric optical member 1, 2 is placed between the projection lens 36 and the wafer 38. As shown, the toric optical member 1, 2 has, in order from the side of wafer 38, a negative cylindrical lens 1 with a concave surface facing the reticle 35 and a positive cylindrical lens 2 with a convex surface facing the wafer 38. This arrangement can exert greater contribution on correction of magnification error with little affecting the astigmatism, as in the embodiment shown in FIG. 12. Accordingly, this arrangement is effective (as the embodiment shown in FIG. 12 is similarly effective) to cases where a large magnification error remains in the projection lens 36.

FIG. 14B shows an example where the projection lens 36 is composed of a front group 36A and a rear group 36B, and the toric optical member 1, 2 is placed between the front group 36A and the rear group 36B, i.e., at or near the pupil position of the projection lens 36. As shown, the toric optical member 1, 2 has a negative cylindrical lens 1 with a concave surface facing the wafer 38 and a positive cylindrical lens 2 with a convex surface facing the reticle 35. This arrangement can exert greater contribution on the correction of astigmatism with little affecting the magnification error. Accordingly, this arrangement is effective to cases where a large astigmatism remains in the projection lens 36.

FIG. 14C shows an example where the toric optical member 2A, 2B is separately arranged, one on the reticle 35 side and the other on the wafer 38 side with the projection lens 36 in-between. As shown, a first positive cylindrical lens 2A with a convex surface facing the wafer 38 is set between the reticle 35 and the projection lens 36 and a second positive cylindrical lens 2B with a convex surface facing the reticle 35 is set between the projection lens 36 and the wafer 38. Similarly as in the examples shown in FIG. 12 and FIG. 14A, this arrangement can exert greater contribution on the correction of magnification error with little affecting the astigmatism.

FIG. 14D shows an example of application of FIG. 14C, wherein negative cylindrical lenses 1A, 1B are combined with associated positive cylindrical lenses 2A, 2B set on the reticle 35 side and on the wafer 38 side, respectively, with the projection lens 36 in-between. This arrangement can exert greater contribution on the correction of magnification error with little affecting the astigmatism. In this case, out of the first toric optical member 1A, 2A and the second toric optical member 1B, 2B, one is mainly used to correct the magnification error remaining in the projection lens 36 while the other is used to correct the magnification error due to expansion or contraction of wafer 38. Further, if, based on this arrangement, the first toric optical member 1A, 2A and the second toric optical member 1B, 2B are arranged so that one of them has a strong power but the other a weak power, the one toric optical member with strong power can be used to coarsely adjust the magnification error with little affecting the astigmatism, while the other toric optical member with weak power can be used to finely adjust the magnification error with little affecting the astigmatism.

FIG. 14E shows another example of application based on a combination of FIG. 14A with FIG. 14B. As shown, a first toric optical member 1A, 2A composed of a negative cylindrical lens 1A and a positive cylindrical lens 2A is set between the reticle 35 and the projection lens (front group 36A), and a second toric optical member 1B, 2B composed of a negative cylindrical lens 1B and a positive cylindrical lens 2B is set between the front group 36A and the rear group 36B (at or near the pupil position of projection lens 36) in the projection lens 36. According to this arrangement, the first toric optical member 1A, 2A can adjust the magnification error with little affecting the astigmatism, while the second toric optical member 1B, 2B can adjust the astigmatism with little affecting the magnification error. Namely, the magnification error and the astigmatism can be corrected independent of each other.

FIG. 14F shows an example of a combination of FIG. 14D with FIG. 14E, which can correct the magnification error and the astigmatism independently of each other and which can perform coarse adjustment and fine adjustment of each of the magnification error and the astigmatism.

In the above description, the cylindrical lenses 1, 2 etc. as the toric optical member are provided separately from the projection lens 36, but some lenses constituting the projection lens 36 may be arranged to have a rotationally asymmetric power. A projection lens 36 having such structure is next described.

Figure 15:
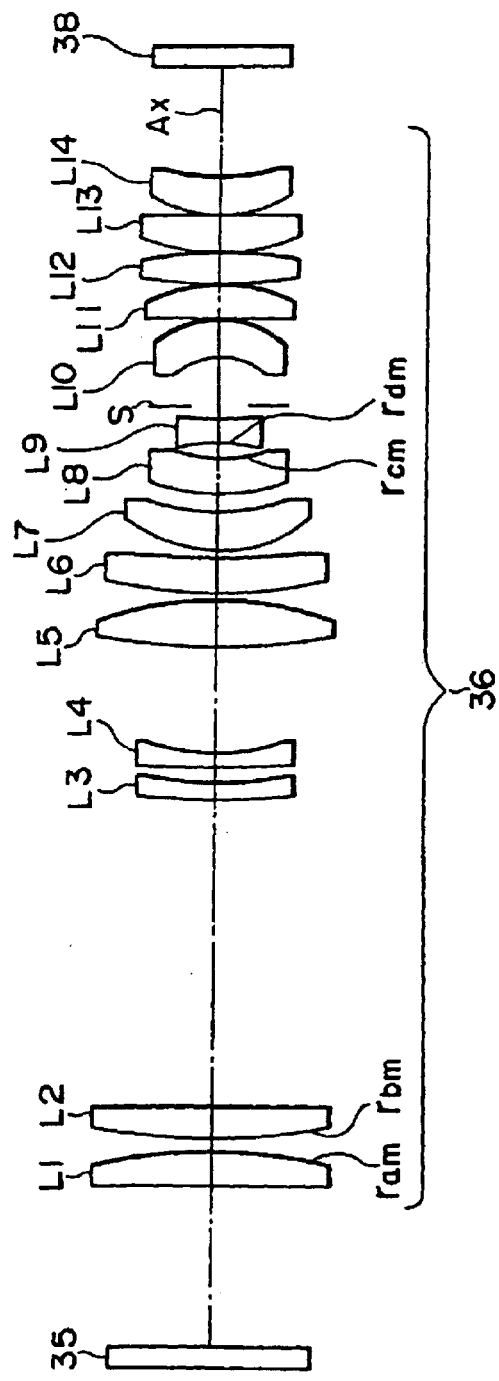
FIG. 15 is a structural drawing to show an embodiment in which some constituent lenses of the projection lens are toric optical members having a rotationally asymmetric lens power.

In the projection lens 36 shown in FIG. 15, one surface of each of lenses L1, L2 is processed into a toric surface to have a curvature $r_{am}$, $r_{bm}$ in the direction of the plane of FIG. 15.

Figure 16:
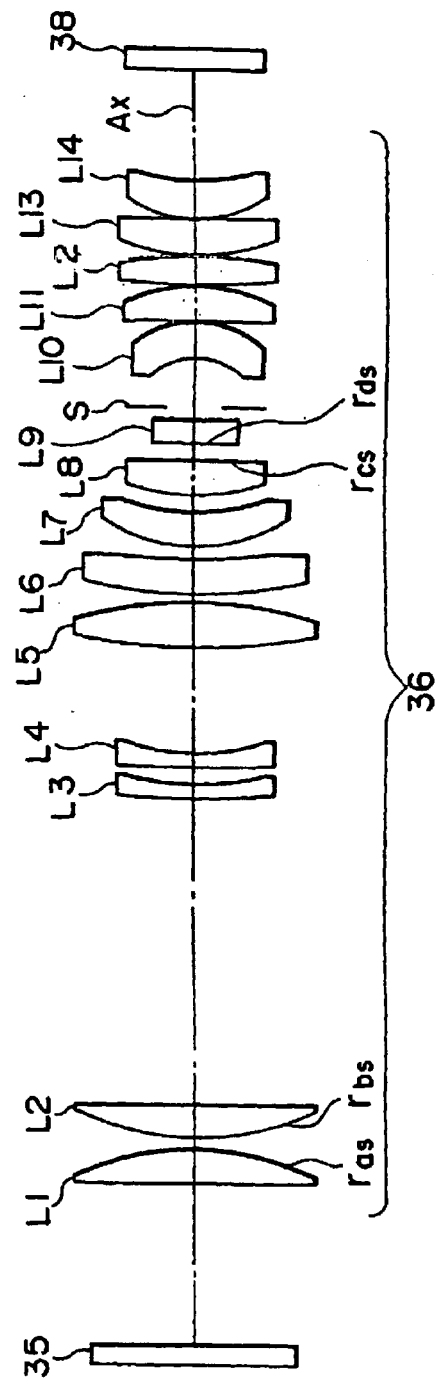
FIG. 16 is a lens constitutional drawing to show an appearance of the projection lens shown in FIG. 15 when it is seen along a direction parallel to the plane of FIG. 15.

FIG. 16 shows a state where the projection lens 36 shown in FIG. 15 is observed in the direction of the plane of FIG. 15 (or in the direction parallel to the plane of FIG. 15).

The lenses L1, L2 processed into a toric surface have respective curvatures $r_{as}$, $r_{bs}$ in the direction of the plane of FIG. 16, as keeping the following relations.

$r_{am} \neq r_{as}$ $r_{bm} \neq r_{bs}$

The lenses L1, L2 processed into a toric surface are rotatable about the optical axis Ax and rotatable by the drive unit 46.

If formula (33) is satisfied by a power difference Δf in two mutually orthogonal directions of the toric surface in the lens L1, L2, the rotationally asymmetric magnification error can be corrected well while controlling the astigmatism amount within the reticle-side depth of focus of the projection lens 36.

Similarly, one surface of lens L8, L9 in the projection lens 36 is processed into a toric surface, and the lenses L8, L9 are rotatable about the optical axis Ax by the drive unit 46.

The toric surfaces have respective curvatures $r_{cm}$, $r_{dm}$ in the direction of the plane of FIG. 15 and respective curvatures $r_{cs}$, $r_{ds}$ in the direction of the plane of FIG. 16. Also, there are the following relations between the curvatures.

$r_{cm} \neq r_{cs}$ $r_{dm} \neq r_{ds}$

If the power difference Δf in two mutually orthogonal directions of the toric surface in each lens L8, L9 is selected so as to decrease the rotationally asymmetric magnification error given by formula (38), the astigmatism can be corrected well while suppressing generation of the rotationally asymmetric magnification error.

Figure 17:
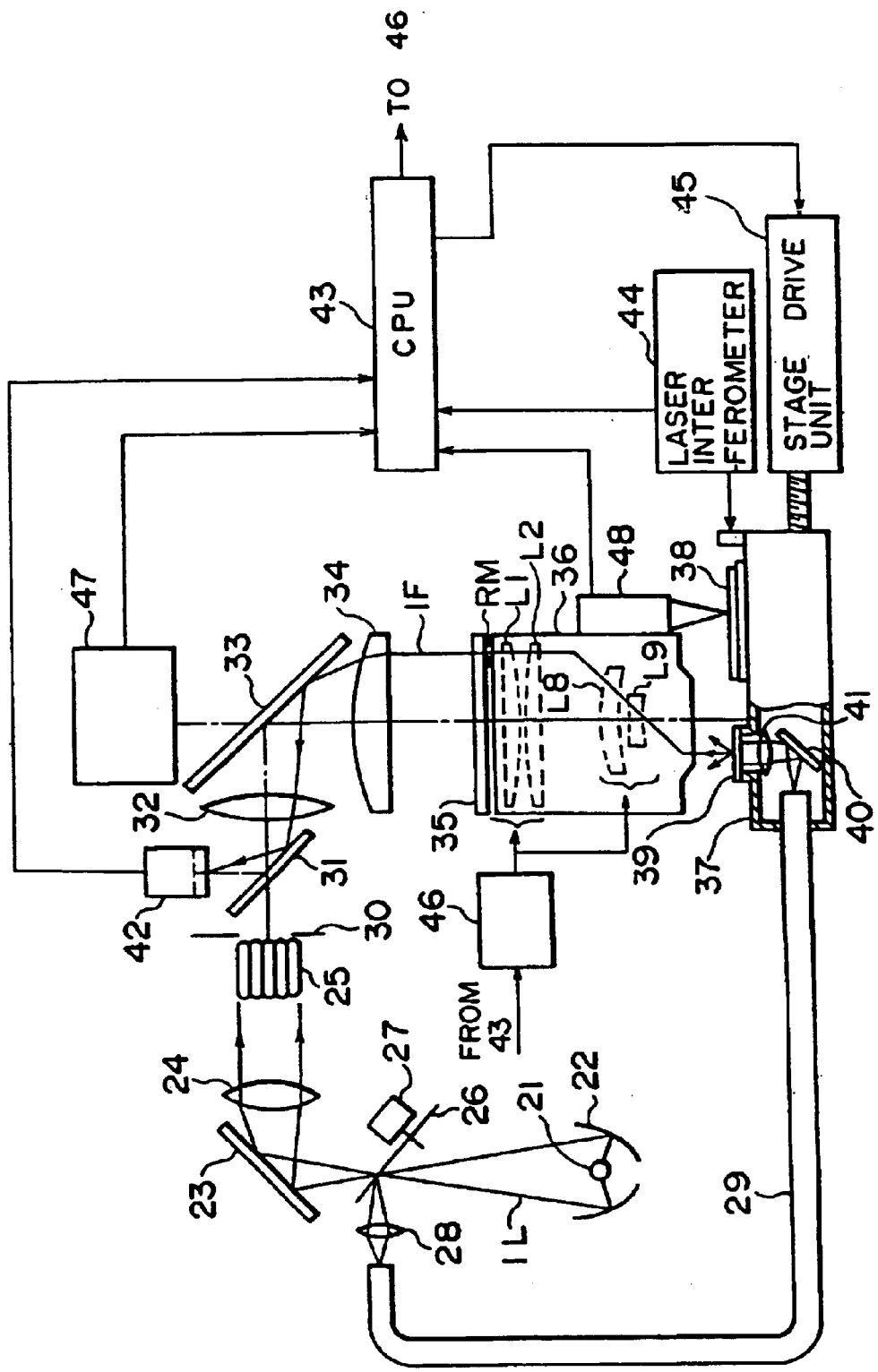
FIG. 17 is a drawing to show the overall structure of an embodiment using the projection lens shown in FIG. 15 and FIG. 16.

FIG. 17 shows the structure of an entire system using such a projection lens 36. The drive unit 46 rotates either one pair out of the pair of lenses L1, L2 and the pair of lenses L8, L9.

In the projection lens system 36 shown in FIG. 15 and FIG. 16, lenses other than the lenses L1, L2, L8, L9, that is, some of lenses L3 to L7, L10 to L14 may be arranged as a toric optical member.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 5-323721 filed on Dec. 22, 1993 is hereby incorporated by reference.

What is claimed is:

1. A projection exposure apparatus comprising:
    an illumination optical system disposed in an optical path between a light source and a reticle so as to illuminate the reticle on which a predetermined pattern is formed;
    a projection optical system disposed in an optical path between the reticle and a substrate so as to project an image of the reticle illuminated by the illumination optical system onto the substrate; and
    an optical adjusting unit including at least four surfaces which are disposed in the optical path between the reticle and the substrate and which have rotationally asymmetric power with respect to an optical axis of the projection optical system so as to correct a remaining optical characteristic that is rotationally asymmetric with respect to the optical axis of the projection optical system,
    wherein at least one of the at least four surfaces is adjustable.

2. A projection exposure apparatus according to claim 1, wherein said at least one adjustable surface is rotatable about the optical axis of said projection optical system.

3. A projection exposure apparatus according to claim 1, wherein said at least one adjustable surface is movable along the optical axis of said projection optical system.

4. A projection exposure apparatus according to claim 1, wherein said at least four surfaces comprise a first surface having different powers in orthogonal directions, a second surface having different powers in orthogonal directions, a third surface having different powers in orthogonal directions, and a fourth surface having different powers in orthogonal directions.

5. A projection exposure apparatus according to claim 4, wherein said first surface is arranged near said second surface; and wherein said third surface is arranged near said fourth surface.

6. A projection exposure apparatus according to claim 5, wherein said optical adjusting unit further comprises an adjusting system to adjust at least one of said first surface and said second surface and to adjust at least one of said third surface and said fourth surface.

7. A projection exposure apparatus according to claim 1, wherein each of said at least four surfaces is disposed either between the reticle and said projection optical system, inside said projection optical system, or between said projection optical system and the substrate.

8. A projection exposure apparatus according to claim 1, wherein said projection optical system comprises an optical element including an aspherical surface disposed in the optical path between the reticle and the substrate so as to correct an optical characteristic remaining in said projection optical system.

9. A projection exposure apparatus according to claim 8, wherein said aspherical surface is processed locally so as to correct a random optical characteristic remaining in said projection optical system.

10. A projection exposure apparatus according to claim 8, wherein said aspherical surface is formed on a lens surface of said projection optical system.

11. A projection exposure apparatus comprising:
an illumination optical system disposed in an optical path between a light source and a reticle so as to illuminate the reticle on which a predetermined pattern is formed; and
a projection optical system disposed in an optical path between the reticle and a substrate to project an image of the reticle illuminated by the illumination optical system onto the substrate;
the projection optical system comprising an optical adjusting unit including at least four surfaces which are disposed in an optical path between the reticle and the substrate and which have rotationally asymmetric power with respect to an optical axis of the projection optical system so as to correct a remaining optical characteristic that is rotationally asymmetric with respect to the optical axis of the projection optical system,
wherein at least one of the at least four surfaces is adjustable.

12. A projection exposure apparatus according to claim 11, wherein said at least one adjustable surface is rotatable about the optical axis of said projection optical system.

13. A projection exposure apparatus according to claim 11, wherein said at least one adjustable surface is movable along the optical axis of said projection optical system.

14. A projection exposure apparatus according to claim 11, wherein said at least four surfaces comprise a first surface having different powers in orthogonal directions, a second surface having different powers in orthogonal directions, a third surface having different powers in orthogonal directions, and a fourth surface having different powers in orthogonal directions.

15. A projection exposure apparatus according to claim 14, wherein said first surface is arranged near said second surface; and said third surface is arranged near said fourth surface.

16. A projection exposure apparatus according to claim 15, wherein said optical adjusting unit further comprises an adjusting system to adjust at least one of said first surface and said second surface and to adjust at least one of said third surface and said fourth surface.

17. A projection exposure apparatus according to claim 11, wherein said projection optical system comprises an optical element including an aspherical surface disposed in the optical path between the reticle and the substrate so as to correct an optical characteristic remaining in said projection optical system.

18. A projection exposure apparatus according to claim 17, wherein said aspherical surface is processed locally so as to correct a random optical characteristic remaining in said projection optical system.

19. A projection exposure apparatus according to claim 17, wherein said aspherical surface is formed on a lens surface of said projection optical system.

20. A projection exposure apparatus comprising:
an illumination optical system disposed in an optical path between a light source and a reticle so as to illuminate the reticle on which a predetermined pattern is formed;
a projection optical system disposed in an optical path between the reticle and a substrate so as to project an image of the reticle illuminated by said illumination optical system onto the substrate;
an optical adjusting unit including at least one optical surface disposed in the optical path between the reticle and the substrate so as to correct a first optical characteristic remaining in said projection optical system; and
a correction optical element including an aspherical surface fixed in the optical path between the reticle and the substrate so as to correct a second optical characteristic remaining in said projection optical system.

21. A projection exposure apparatus according to claim 20, wherein said at least one optical surface has rotationally asymmetric power with respect to an optical axis of said projection optical system so as to correct the first optical characteristic which is rotationally asymmetric with respect to the optical axis of said projection optical system.

22. A projection exposure apparatus according to claim 21, wherein said at least one optical surface is rotatable about the optical axis of said projection optical system.

23. A projection exposure apparatus according to claim 21, wherein said at least one optical surface is movable along the optical axis of said projection optical system.

24. A projection exposure apparatus according to claim 21, wherein said at least one optical surface has different powers in orthogonal directions.

25. A projection exposure apparatus according to claim 21, wherein said at least one optical surface is disposed either between the reticle and said projection optical system, inside said projection optical system, or between said projection optical system and the substrate.

26. A projection exposure apparatus according to claim 20, wherein said second optical characteristic is a random optical characteristic remaining in said projection optical system.

27. A projection exposure apparatus according to claim 26, wherein said aspherical surface is processed locally.

28. A projection exposure apparatus according to claim 20, wherein said aspherical surface is formed on a lens surface of said projection optical system.

29. A projection exposure apparatus comprising:
an illumination optical system disposed in an optical path between a light source and a reticle so as to illuminate the reticle on which a predetermined pattern is formed; and
a projection optical system to project an image of the reticle illuminated by said illumination optical system onto a substrate;

said projection optical system comprising:
an optical adjusting unit including at least one optical surface disposed in an optical path between the reticle and the substrate so as to correct a first optical characteristic remaining in said projection optical system; and
a correction optical element including an aspherical surface fixed in the optical path between the reticle and the substrate so as to correct a second optical characteristic remaining in said projection optical system.

30. A projection exposure apparatus according to claim 29, wherein said at least one optical surface has rotationally asymmetric power with respect to an optical axis of said projection optical system so as to correct the first optical characteristic which is rotationally asymmetric with respect to the optical axis of said projection optical system.

31. A projection exposure apparatus according to claim 30, wherein said at least one optical surface is rotatable about the optical axis of said projection optical system.

32. A projection exposure apparatus according to claim 30, wherein said at least one optical surface is movable along the optical axis of said projection optical system.

33. A projection exposure apparatus according to claim 31, wherein said at least one optical surface has different powers in orthogonal directions.

34. A projection exposure apparatus according to claim 29, wherein the second optical characteristic is a random optical characteristic remaining in said projection optical system.

35. A projection exposure apparatus according to claim 34, wherein said aspherical surface is processed locally.

36. A projection exposure apparatus according to claim 29, wherein said aspherical surface is formed on a lens surface of said projection optical system.

37. An exposure method utilizing the projection exposure apparatus according to claim 1, said method comprising the steps of:
illuminating a reticle having a predetermined pattern by using said illumination optical system in the projection exposure apparatus; and
projecting an image of the reticle onto a substrate by using said projection optical system in the projection exposure apparatus.

38. An exposure method utilizing the projection exposure apparatus according to claim 11, said method comprising the steps of:
illuminating a reticle having a predetermined pattern by using said illumination optical system in the projection exposure apparatus; and
projecting an image of the reticle onto a substrate by using said projection optical system in the projection exposure apparatus.

39. An exposure method utilizing the projection exposure apparatus according to claim 20, said method comprising the steps of:
illuminating a reticle having a predetermined pattern by using said illumination optical system in the projection exposure apparatus; and
projecting an image of the reticle onto a substrate by using said projection optical system in the projection exposure apparatus.

40. An exposure method utilizing the projection exposure apparatus according to claim 29, said method comprising the steps of:
illuminating a reticle having a predetermined pattern by using said illumination optical system in the projection exposure apparatus; and
projecting an image of the reticle onto a substrate by using said projection optical system in the projection exposure apparatus.

41. A method of manufacturing a projection optical system for forming an image of a pattern on a reticle onto a substrate comprising:
rotating at least one optical element within said projection optical system so as to correct a first optical characteristic remaining in said projection optical system; and
forming an aspherical surface with respect to an optical element within said projection optical system so as to correct a second optical characteristic remaining in said projection optical system.

42. A method according to claim 41, wherein said second optical characteristic is a random optical characteristic remaining in said projection optical system.

43. A method according to claim 42, wherein said forming step includes the step of locally processing said optical element within said projection optical system.

44. A method according to claim 41, wherein said optical element with respect to which said aspherical surface is formed includes a lens.

45. A method according to claim 41, wherein said optical element with respect to which said aspherical surface is formed includes an optical plate.

46. A method of manufacturing a projection optical system for forming an image of a pattern on a reticle onto a substrate comprising:
rotating at least one optical element within said projection optical system so as to correct a first optical characteristic remaining in said projection optical system; and
disposing a correction element in an optical path between an object surface to which the reticle is to be disposed and an image surface to which the substrate is to be disposed, said correction element including an aspherical surface that corrects a second optical characteristic remaining in said projection optical system.

47. A method according to claim 46, wherein said second optical characteristic is a random optical characteristic remaining in said projection optical system.

48. A method according to claim 47, wherein said aspherical surface is formed by locally processing an optical element within said projection optical system.

49. A method according to claim 46, wherein said correction element with respect to which said aspherical surface is formed includes a lens.

50. A method according to claim 46, wherein said correction element with respect to which said aspherical surface is formed includes an optical plate.

51. A method of manufacturing an exposure apparatus comprising:
providing a projection optical system that forms an image of a pattern on a reticle onto a substrate:
rotating at least one optical element within said projection optical system so as to correct a first optical characteristic remaining in said projection optical system; and
forming an aspherical surface with respect to an optical element within said projection optical system so as to correct a second optical characteristic remaining in said projection optical system.

52. A method of manufacturing an exposure apparatus comprising:
providing a projection optical system that forms an image of a pattern on a reticle onto a substrate:
rotating at least one optical element within said projection optical system so as to correct a first optical characteristic remaining in said projection optical system; and disposing a correction element in an optical path between an object surface to which the reticle is to be disposed and an image surface to which the substrate is to be disposed, said correction element including an aspherical surface that corrects a second optical characteristic remaining in said projection optical system.

53. A method of projecting an image of a reticle having a pattern onto a substrate by using a projection system, said method comprising the steps of:
providing a first magnification adjustment to light incident on said projection system;
passing light provided with the first magnification adjustment through said projection system; and
providing a second magnification adjustment to light having passed through said projection system.

54. A method according to claim 53, wherein said step for the first magnification adjustment comprises the step of adjusting at least one optical element of a first set of optical elements arranged between the reticle and said projection system; and wherein said step for the second magnification adjustment comprises the step of adjusting at least one optical element of a second set of optical elements arranged between said projection system and the substrate.

55. A method according to claim 53, wherein at least one of the first magnification adjustment and the second magnification adjustment is performed in accordance with an expansion or contraction of the substrate.

56. A projection system for projecting an image of a reticle having a pattern onto a substrate, comprising:
a first magnification adjustment system disposed in an optical path between the reticle and said projection system; and
a second magnification adjustment system disposed in an optical path between said projection system and the substrate.

57. A projection system according to claim 56, wherein said first magnification adjustment system comprises a first set of optical elements including at least one adjustable element; and wherein said second magnification adjustment system comprises a second set of optical elements including at least one adjustable element.

58. A projection system according to claim 56, wherein at least one of the first magnification adjustment system and the second magnification adjustment system adjusts at least one of the first magnification adjustment and the second magnification adjustment in accordance with an expansion or contraction of the substrate.

59. A projection system according to claim 56, wherein said projection system comprises an aspherical surface fixed in the optical path between the reticle and the substrate.

60. A projection system according to claim 56, wherein said aspherical surface corrects a remaining random optical characteristic of said projection optical system.

61. An exposure method utilizing the projection system according to claim 56, comprising the steps of:
illuminating a reticle with light; and
projecting an image of a pattern formed on the reticle onto a substrate by using said projection system.

62. An exposure method utilizing the projection system according to claim 59, comprising the steps of:
illuminating a reticle with light; and
projecting an image of a pattern formed on the reticle onto a substrate by using said projection system.

63. An exposure method utilizing the projection system according to claim 60, comprising the steps of:
illuminating a reticle with light; and
projecting an image of a pattern formed on the reticle onto a substrate by using said projection system.

64. A method of manufacturing a projection optical system for forming an image of a pattern on a reticle onto a substrate comprising:
correcting a non-random optical characteristic remaining in said projection optical system by using at least one optical element within said projection optical system; and
correcting a random optical characteristic remaining in said projection optical system by using an aspherical surface having a random optical power.

65. A method according to claim 64, wherein said step of correcting the non-random optical characteristic comprises the step of adjusting said at least one optical element, which includes a surface having different powers in orthogonal directions.

66. A method according to claim 64, wherein said aspherical surface is processed locally.

67. A method of manufacturing an exposure apparatus comprising:
providing a projection optical system that forms an image of a pattern on a reticle onto a substrate;
correcting a non-random optical characteristic remaining in said projection optical system by using at least one optical element within said projection optical system; and
correcting a random optical characteristic remaining in said projection optical system by using an aspherical surface having a random optical power.

68. A method according to claim 67, wherein said step of correcting the non-random optical characteristic comprises the step of adjusting said at least one optical element, which includes a surface having different powers in orthogonal directions.

69. A method according to claim 67, wherein said aspherical surface is processed locally.

70. A method of manufacturing a projection optical system for forming an image of a first object onto a second object, comprising the steps of:
providing a first optical element;
providing a second optical element;
adjusting said first optical element within said projection optical system so as to correct a first optical characteristics remaining in said projection optical system;
forming an aspherical surface with respect to said second optical element so as to correct a second optical characteristics remaining in said projection optical system; and
disposing said second optical element in an optical path between said first object and said second object.

71. The method according to claim 70, wherein in said second optical element providing step, said second optical element comprises an optical surface having any one of a spherical shape, a planer shape and a toric surface and in said forming step, said second optical element is formed with an aspherical surface.

72. The method according to claim 71, wherein in said adjusting step, said adjustment is performed by rotating said first optical element.

73. The method according to claim 72, wherein in said adjusting step, said adjustment is performed by moving said first optical element in an optical axis direction.

74. The method according to claim 71, wherein said second optical characteristic comprises a random component.

75. The method according to claim 70, wherein said first optical characteristic comprises a rotationally asymmetrical aberration.

76. A projection optical system formed by a method according to claim 71.

77. A projection exposure apparatus comprising:
an illumination optical system disposed in an optical path between a light source and a reticle so as to illuminate the reticle on which a predetermined pattern is formed; and
a projection optical system according to claims, to project an image of the reticle illuminated by said illumination optical system onto a substrate.

78. A projection optical system for forming an image of a first object onto a second object, comprising:
a first optical correcting unit including at least one surface arranged in an optical path between said first object and said second object, which corrects a first optical characteristic remaining in said projection optical system; and
a second optical correcting unit including at least one surface arranged in an optical path between said first object and said second object, which corrects a second optical characteristic remaining in said projection optical system,
wherein said first correcting unit is arranged at a position different from a position of said second optical correcting unit,
said first optical correcting unit corrects said first optical characteristic independently of said second optical characteristic, and
said second optical correcting unit corrects said second optical characteristic independently of said first optical characteristic.

79. A projection exposure apparatus comprising:
an illumination optical system disposed in an optical path between a light source and a reticle so as to illuminate the reticle on which a predetermined pattern is formed; and
a projection optical system according to claim 78, to project an image of the reticle illuminated by said illumination optical system onto a substrate.

80. A method of manufacturing a projection optical system for forming an image of a pattern on a reticle disposed at a first plane onto a substrate disposed at a second plane, comprising the steps of:
determining a first rotate angle of a first optical element about an optical axis of the projection optical system;
determining a second rotate angle of a second optical element about the optical axis of the projection optical system; and
determining a third rotate angle of a third optical element about the optical axis of the projection optical system,
wherein the first, second and third optical elements each having the first, second, and third rotate angles are arranged in an optical path between the first plane and the second plane.

81. A method according to claim 80, wherein the first, second, and third optical elements each have different powers in orthogonal directions.

82. A method according to claim 80, wherein the first, second, and third optical elements each have a predetermined refractive index distribution.

83. A method according to claim 80, further comprising a step of preparing an optical parameter of the projection optical system,
wherein the first, second, and third rotate angles of the first, second and third optical elements are determined to account for the optical parameter of the projection optical system.

84. A projection optical system manufactured by the method according to claim 80.

85. A method of manufacturing an exposure apparatus for forming an image of a pattern on a reticle disposed at a first plane onto a substrate disposed at a second plane, comprising the steps of:
preparing a light source;
preparing an illumination optical system for illuminating the pattern on the reticle based on a light from the light source;
preparing a projection optical system for forming the image of the pattern on the reticle onto the substrate;
determining a first rotate angle of a first optical element which is arranged in an optical path between the light source and the second plane;
determining a second rotate angle of a second optical element which is arranged in the optical path between the light source and the second plane; and
determining a third rotate angle of a third optical element which is arranged in the optical path between the light source and the second plane.

86. A method according to claim 85, wherein the first, second, and third optical elements are arranged in an optical path between the first plane and the second plane.

87. A method according to claim 85, wherein the first, second, and third optical elements each have different powers in orthogonal directions.

88. A method according to claim 85, wherein the first, second, and third optical elements each have a predetermined refractive index distribution.

89. A method according to claim 85, further comprising a step of preparing an optical parameter of the projection optical system,
wherein the first, second, and third rotate angles of the first, second, and third optical elements are determined to account for the optical parameter of the projection optical system.

90. An exposure apparatus manufactured by the method according to claim 85.

91. A projection exposure apparatus according to claim 32, wherein the at least one optical surfaces has different powers in orthogonal directions.

92. A projection exposure apparatus according to claim 30, herein the aspherical surface is processed locally.

93. A projection exposure apparatus according to claim 92, wherein the first optical characteristic is a random optical characteristic remaining in the projection optical system.

94. A method according to claim 41, wherein the forming step includes the step of locally processing the optical element within the projection optical system.

95. A method according to claim 46, wherein the aspherical surface is formed by locally processing an optical element within the projection optical system.

96. A method according to claim 53, wherein the magnification includes a magnification error of the projection optical system.

97. A projection system according to claim 56, wherein the magnification includes a magnification error of the projection optical system.

98. A projection exposure apparatus which transfers an image of a first object onto a second object based on light from a light source, comprising:

an illumination optical system which is disposed in an optical path between the light source and the first object and which illuminates the first object;

a projection optical system which is disposed in an optical path between the first object and the second object and which projects an image of the first object onto the second object;

a first optical unit which is disposed in the optical path between the first object and the second object and which has different powers in orthogonal directions; and a second optical unit which is disposed in the optical path between the first object and the second object and which has different powers in orthogonal directions, wherein a focal length of the first optical unit and a focal length of the second optical unit are changeable without moving or rotating the first and second optical units.

99. A projection exposure apparatus according to claim 98, wherein the projection optical system has the first and second optical units.

100. A projection exposure method for transferring an image of a first object onto a second object, comprising the steps of:

illuminating the first object;

projecting an image of the first object onto the second object;

preparing a first optical unit having different powers in orthogonal directions in an optical path between the first object and the second object;

preparing a second optical unit having different powers in orthogonal directions in an optical path between the first object and the second object; and changing a focal length of the first optical unit and a focal length of the second optical unit without moving or rotating the first and second optical units.

101. A projection exposure apparatus which transfers an image of a first object onto a second object based on light from a light source, comprising:

an illumination optical system which is disposed in an optical path between the light source and the first object and which illuminates the first object;

a projection optical system which is disposed in an optical path between the first object and the second object and which projects an image of the first object onto the second object;

an optical unit which is disposed in the optical path between the first object and the second object and which has rotationally asymmetric power with respect to an optical axis of the projection optical system; and a pressure control unit which controls a pressure between constituent lenses of the projection optical system, wherein the optical unit and the pressure control unit correct an optical characteristic including a rotational asymmetrical characteristic remaining in the projection optical system with respect to the optical axis of the projection optical system.

102. A projection exposure apparatus according to claim 101, wherein the optical unit is at least one of rotatable about the optical axis of the projection optical system and movable along the optical axis of the projection optical system.

103. A projection exposure apparatus for projecting a pattern onto a substrate, comprising:

a projection optical system;

an asymmetrical magnification adjustor that adjusts a first magnification of the projection optical system and a second magnification of the projection optical system, wherein the first magnification is a magnification of the projection optical system along a first direction on the substrate, wherein the second magnification is a magnification of the projection optical system along a second direction that is perpendicular to the first direction on the substate, and wherein the asymmetrical magnification adjustor comprises a surface that has asymmetrical power with respect to an optical axis of the projection optical system and that is rotatable about the optical axis.

104. The projection exposure apparatus according to claim 103, wherein the surface of the asymmetrical magnification adjustor is movable along the optical axis.

105. The projection exposure apparatus according to claim 103, wherein the asymmetrical magnification adjustor includes a second surface that has rotationally asymmetric powere with respect to the optical axis, and wherein the second surface is adjustable.

106. The projection exposure apparatus according to claim 103, wherein the asymmetrical magnification adjustor operates on at least one of nonlinear extension of the substrate and nonlinear contraction of the substrate.

107. The projection exposure apparatus according to claim 106, wherein the projection optical system is arranged between a mask and the substrate and projects an image of the mask onto the substrate, and wherein the asymmetrical magnification adjustor is arranged in at least one of an optical path between the mask and the projection optical system and an optical path between the projection optical system and the image.

108. A projection exposure apparatus for projecting a pattern on to a substrate, comprising:

a projection optical system that is arranged in an optical path between a first surface and a second surface, and that has an asymmetrical power optical element with an asymmetrical power in relation to an optical axis of the projection optical system, wherein the asymmetrical power optical element is rotatable about the optical axis, and an asymmetrical magnification of the projection optical system is adjustable.

109. An projection exposure apparatus for projecting a pattern of a mask onto a substrate, comprising:

a projection optical system;

an asymmetrical magnification adjustor that is arranged in at least one of a mask side optical path of the projection optical system and a substrate side optical path of the projection optical system, and that adjusts a first magnification of the projection optical system and a second magnification of the projection optical system, wherein the first magnification is a magnification of the projection optical system along a first direction on the substrate, and wherein the second magnification is a magnification of the projection optical system along a second direction that is perpendicular to the first direction on the substrate.

110. The projection exposure apparatus according to claim 109, wherein the asymmetrical magnification adjustor includes a surface that has rotationally asymmetric power with respect to an optical axis of the projection optical system.

111. The projection exposure apparatus according to claim 110, wherein the surface with rotationally asymmetric power is adjustable.

112. The projection exposure apparatus according to claim 111, wherein the adjustable surface is movable along the optical axis.

113. The projection exposure apparatus according to claim 111, wherein the adjustable surface is rotatable about the optical axis.

114. A method according to claim 111, wherein the asymmetrical magnification adjustor includes a second surface that has rotationally asymmetric power with respect to the optical axis, and wherein the second surface is adjustable.

115. The projection exposure apparatus according to claim 111, wherein the projection optical system includes the asymmetrical magnification adjustor.

116. A method according to claim 109, wherein the asymmetrical magnification adjustor operates on at least one of nonlinear extension of the substrate and nonlinear contraction of the substrate.

* * * * *